(12) United States Patent
Kimura et al.

(10) Patent No.: US 7,732,239 B2
(45) Date of Patent: Jun. 8, 2010

(54) METHOD FOR MANUFACTURING SOLID-STATE IMAGE SENSOR

(75) Inventors: Masatoshi Kimura, Tokyo (JP); Hiroki Honda, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 14 days.

(21) Appl. No.: 12/050,930

(22) Filed: Mar. 18, 2008

(65) Prior Publication Data

US 2008/0254564 A1  Oct. 16, 2008

(30) Foreign Application Priority Data

Apr. 12, 2007  (JP) .............................. 2007-104554

(51) Int. Cl.
*H01L 21/00* (2006.01)
(52) U.S. Cl. .................. 438/48; 438/113; 438/460; 438/52; 438/E21.133
(58) Field of Classification Search ............. 438/48–52, 438/69–75; 257/291–294
See application file for complete search history.

(56) References Cited

U.S. PATENT DOCUMENTS 5,451,488 A  9/1995  Fukuba
5,561,317 A  10/1996  Momma et al.
5,888,676 A  3/1999  Saitoh
6,204,912 B1  3/2001  Tsuchiya et al.
7,413,921 B2 *  8/2008  Park .......................... 438/57

FOREIGN PATENT DOCUMENTS

| JP | 5-6849 A | 1/1993 |
| JP | 5-62874 A | 3/1993 |
| JP | 6-124869 A | 5/1994 |
| JP | 9-190962 A | 7/1997 |
| JP | 9-298155 A | 11/1997 |
| JP | 11-220116 A | 8/1999 |
| JP | 2003-5346 A | 1/2003 |

* cited by examiner

*Primary Examiner*—Dung A. Le
(74) *Attorney, Agent, or Firm*—Miles & Stockbridge P.C.

(57) ABSTRACT

A method using a divided exposure technology is provided for restraining deterioration in the performance of a solid-state image sensor. A photoresist is formed over a semiconductor substrate and subjected to divided exposure. A dividing line for divided exposure is located at least over a region of a semiconductor substrate in which an active region in which a pixel is to be formed is defined. The photoresist is then developed and patterned. By utilizing the patterned photoresist, an element isolation structure for defining the active region in the semiconductor substrate is formed in the semiconductor substrate.

12 Claims, 26 Drawing Sheets

METHOD FOR MANUFACTURING SOLID-STATE IMAGE SENSOR

CROSS-REFERENCE TO RELATED APPLICATIONS

The disclosure of Japanese Patent Application No. 2007-104554 filed on Apr. 12, 2007 including the specification, drawings and abstract is incorporated herein by reference in its entirety.

BACKGROUND OF THE INVENTION

The present invention relates to a solid-state image sensor and a manufacturing method thereof.

As described in Japanese Patent Laid-Open Nos. Hei 6 (1994)-124869, Hei 11 (1999)-220116, Hei 9 (1997)-298155, Hei 9 (1997)-190962, Hei 5 (1993)-62874, 2003-5346 and Hei 5 (1993)-6849, when a semiconductor device having a greater surface area than an area exposable by single exposure using an exposure apparatus is formed over a semiconductor substrate, it is the common practice to subject a photoresist formed over the semiconductor substrate to divided exposure. In other words, the photoresist is divided into a plurality of exposure regions and exposure treatment is given to each of the plural regions thus divided.

SUMMARY OF THE INVENTION

In divided exposure treatment, there may occur misalignment between a mask pattern to be used for exposure of one of two adjacent exposure regions of a photoresist and a mask pattern to be used for exposure of the other exposure region, depending on the alignment accuracy of photomasks used for the photoresist or the like. As a result, in the patterned photoresist, such misalignment may lead to misalignment of resist patterns between the two adjacent exposure regions. Some positions of a dividing line for divided exposure where misalignment of resist patterns occurs may greatly deteriorate the properties of the resulting semiconductor device and it is an important problem how to set the position of the dividing line. In particular, in a solid-state image sensor equipped with a plurality of pixels, the plural pixels are placed as densely as possible for the miniaturization of the device so that the above-described misalignment of resist patterns has a serious influence on the properties of the pixels and it is very important how to set the position of the dividing line for divided exposure.

When a solid-state image sensor is manufactured using divided exposure treatment, on the other hand, there may appear a difference in the size of a resist pattern between two adjacent exposure regions of a photoresist, depending on the designing error of a mask pattern or setting error of exposure conditions. As a result, in a semiconductor chip, sizes of the devices thus formed are different between two regions having a dividing line for divided exposure therebetween. Moreover, even within the same exposure region, resist patterns are different in size between a position near the dividing line with the other exposure region and a position near the center distant from the dividing line. As a result, a device size near the dividing line of the exposure region and that distant from the dividing line may differ from each other.

Thus, variations in size sometimes occur between resist patterns or devices with the dividing line for divided exposure as a boundary. In carrying out size inspection of resist patterns or devices, it is necessary to grasp the position of the dividing line in divided exposure treatment.

With the foregoing problems in view, the present invention has been completed. A first object of the invention is to provide a divided exposure technology capable of preventing deterioration in the performance of a solid-stage image sensor.

A second object is to provide a technology facilitating grasping of the position of an exposure dividing line for divided exposure treatment.

In a manufacturing method of a solid-stage image sensor according to one aspect of the present invention, a semiconductor substrate is provided first. A photoresist is then formed over a semiconductor substrate via a protective film. The photoresist is then exposed using a photomask. During this exposure, the photoresist is subjected to divided exposure. Described specifically, the photoresist is divided into a plurality of exposure regions and exposure treatment is given to each of the plural exposure regions. When the photoresist is subjected to divided exposure, the dividing line therefor is positioned at least over a region of the semiconductor substrate in which active regions in which pixels are to be formed are defined. The photoresist thus exposed is then developed and patterned. The protective film exposed from the patterned photoresist is removed and then, the photoresist is removed. The semiconductor substrate exposed from the protective film is then oxidized and an element isolation structure is formed in the semiconductor substrate, whereby in the semiconductor substrate, active regions in which pixel regions are to be formed are defined by the element isolation structure.

The solid-state image sensor according to the one aspect of the present invention is equipped with a semiconductor substrate in which active regions are defined by an element isolation structure and pixels formed in the active regions. The active regions have a plurality of partial active regions in which impurity regions have been formed, respectively. The plural partial active regions include a partial active region having a shape displaced in one direction, in a top view, so as to cause a step difference at the periphery, in a top view.

According to the manufacturing method of the solid-state image sensor in the one aspect of the present invention, when the photoresist used for defining, in the semiconductor substrate, the active regions in which pixels are to be formed is subjected to divided exposure, the dividing line therefor is located at least over a region of the semiconductor substrate in which the active regions are defined. Compared with a case where the dividing line is located only over a region of the semiconductor substrate in which an element isolation structure is to be formed, a portion of the element isolation structure which undergoes a dimensional change can be made smaller. A dimensional change in the element isolation structure may lead to deterioration of electrical insulation properties between devices so that deterioration of the performance of the solid-state image sensor can be suppressed by minimizing a portion of the element isolation structure which undergoes a dimensional change.

According to the solid-state image sensor in the one aspect of the present invention, since the active regions in which pixels are to be formed include partial active regions having a shape displaced in one direction, in a top view, so as to cause a step difference at the periphery, in a top view. When the active regions are defined in the semiconductor substrate and the photoresist is subjected to divided exposure with the position of the step difference of the partial active region as a boundary, it is possible to grasp the position of the dividing line for divided exposure readily by detecting the step difference.

DETAILED DESCRIPTION OF THE PREFERRED EMBODIMENTS

Figure 1:
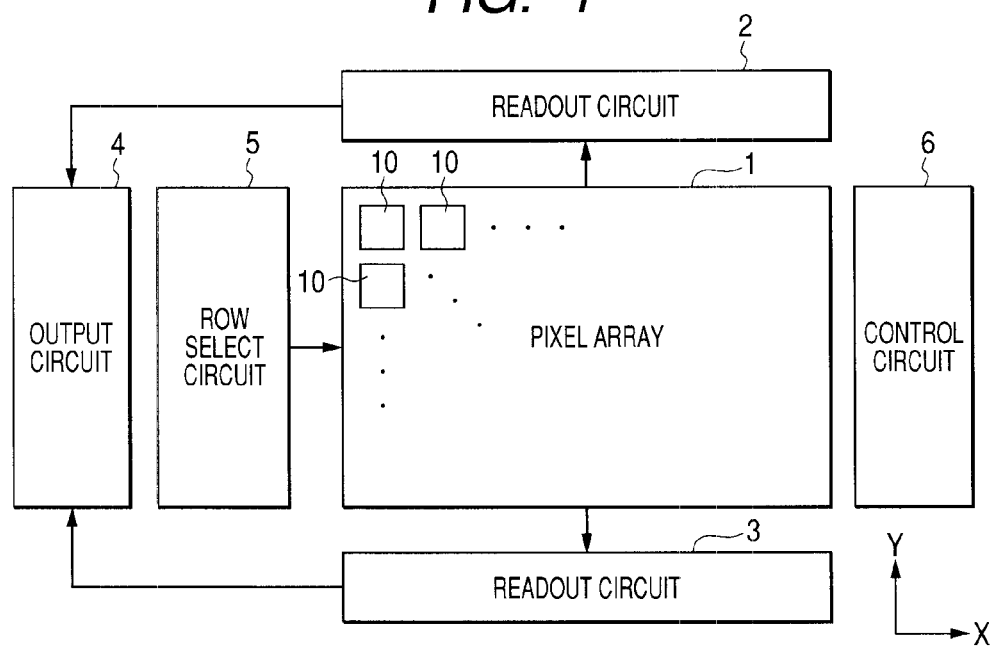
FIG. 1 illustrates the construction of a solid-state image sensor according to an embodiment of the present invention.

FIG. 1 illustrates the construction of the solid-state image sensor according to one embodiment of the present invention. The solid-state image sensor according to this embodiment is a CMOS image sensor. As illustrated in FIG. 1, is has a pixel array portion 1, readout circuits 2,3, output circuit 4, row select circuit 5, and control circuit 6.

In the pixel array portion 1, a plurality of pixels 10 are arranged in a matrix. The X axis direction in FIG. 1 is a direction of a row in which pixels 10 are arranged, while the Y axis direction vertical to the X axis direction is a direction of a column in which pixels 10 are arranged. The plural pixels 10 each produces a signal according to the intensity of light irradiated. The row select circuit 5 selects a plurality of pixels 10 by the row. The pixels 10 selected by the row select circuit 5 output the produced signal to an output line OL which will be described later. The readout circuits 2 and 3 are placed opposite to each other in the Y axis direction while sandwiching the pixel array portion 1 between them. The readout circuits 2 and 3 each reads the signal output to the output line OL from the pixel 10 and then, outputs it to the output circuit 4. The readout circuit 2 reads the signals of half of the pixels 10 which are on the side of the readout circuit 2, while the readout circuit 3 reads the signals of the other half of the pixels 10 which are on the side of the readout circuit 3. The output circuit 4 outputs the signals of the pixels 10 read by the readout circuits 2 and 3 to the outside of the solid-state image sensor. The control circuit 6 totally manages the operation of the whole solid-state image sensor and controls the operation of the other constituents of the solid-state image sensor.

Figure 2:
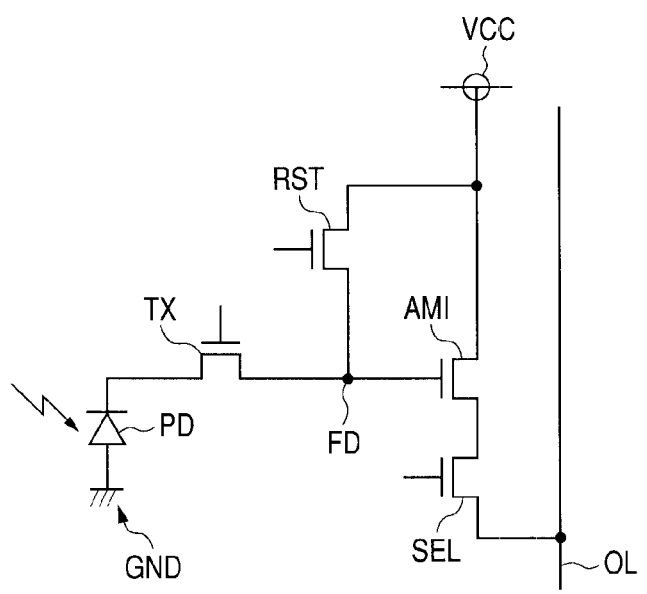
FIG. 2 illustrates the circuit construction of a pixel according to the embodiment of the present invention.

FIG. 2 illustrates the circuit construction of each pixel 10. As illustrated in FIG. 2, the pixel 10 is equipped with a photodiode PD for performing photoelectric conversion, a transfer transistor TX for transferring charges generated at the photodiode PD, a floating diffusion FD for accumulating therein charges transferred from the transfer transistor TX, an amplified MOS imager transistor AMI for amplifying the potential of the floating diffusion FD, a select transistor SEL for selecting whether the potential amplified by the amplified MOS imager transistor AMI is output to the output line OL coupled to one of the readout circuits 2 and 3 or not, and a reset transistor RST for initializing the potential of the cathode of the photodiode PD and floating diffusion FD to a predetermined potential. The transfer transistor TX, reset transistor RST, amplified MOS imager transistor AMI and select transistor SEL are each, for example, an NMOS transistor.

To the anode of the photodiode PD, a ground potential GND, that is, a negative-side power supply potential, is applied and the cathode of it is coupled to the source of the transfer transistor TX. The floating diffusion FD is coupled to the drain of the transfer transistor TX, source of the reset transistor RST, and gate of the amplified MOS imager transistor AMI. To the drain of the reset transistor RST and the drain of the amplified MOS imager transistor AMI, a positive-side power supply potential VCC is applied. The source of the amplified MOS imager transistor AMI is coupled to the drain of the select transistor SEL. The source of the select transistor SEL is coupled to the output line OL coupled to either one of the readout circuits 2 and 3.

The operation of the pixel 10 will next be described. First, a predetermined potential is applied to the gate of the transfer transistor TX and reset transistor RST and both the transfer transistor TX and reset transistor RST are turned ON. Then, charges remaining in the photodiode PD and charges accumulated in the floating diffusion FD flow towards the positive-side power supply potential VCC, whereby the charges of the photodiode PD and floating diffusion FD are initialized. The reset transistor RST is then turned OFF.

An incident light is irradiated to the PN junction of the photodiode PD and photoelectric conversion occurs at the photodiode PD. As a result, charges are produced at the photodiode PD. The charges thus produced are all transferred to the floating diffusion FD by the transfer transistor TX. The charges thus transferred are accumulated in the floating diffusion FD. This changes the potential of the floating diffusion FD.

When the select transistor SEL is then turned ON, the potential of the floating diffusion FD after the change is amplified by the amplified MOS imager transistor AMI and is then output to the output line OL. One of the readout circuits 2 and 3 reads the potential of the output line OL.

Figure 3:
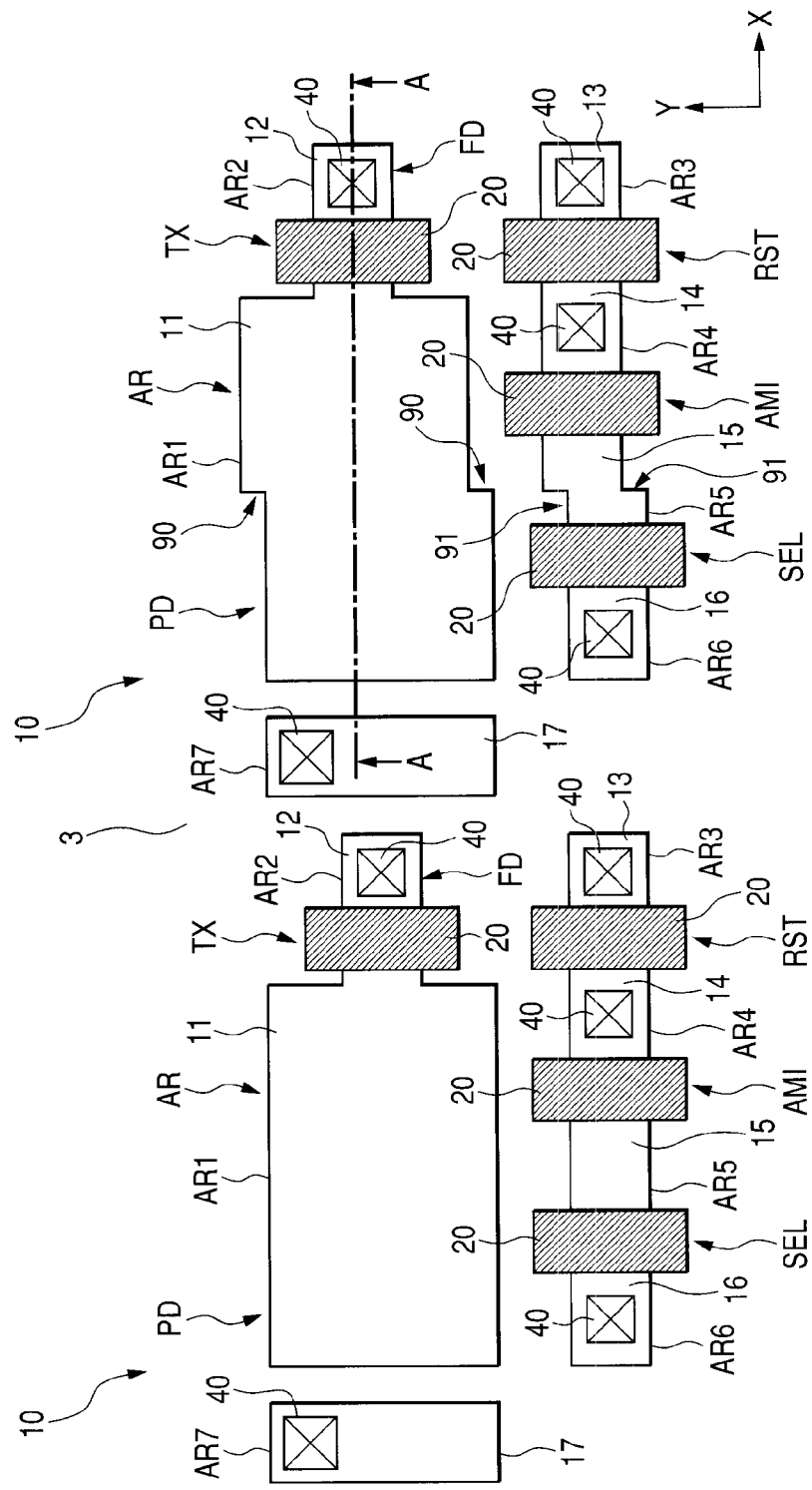
FIG. 3 is a top view illustrating the structure of the pixel according to the embodiment of the present invention.
Figure 4:
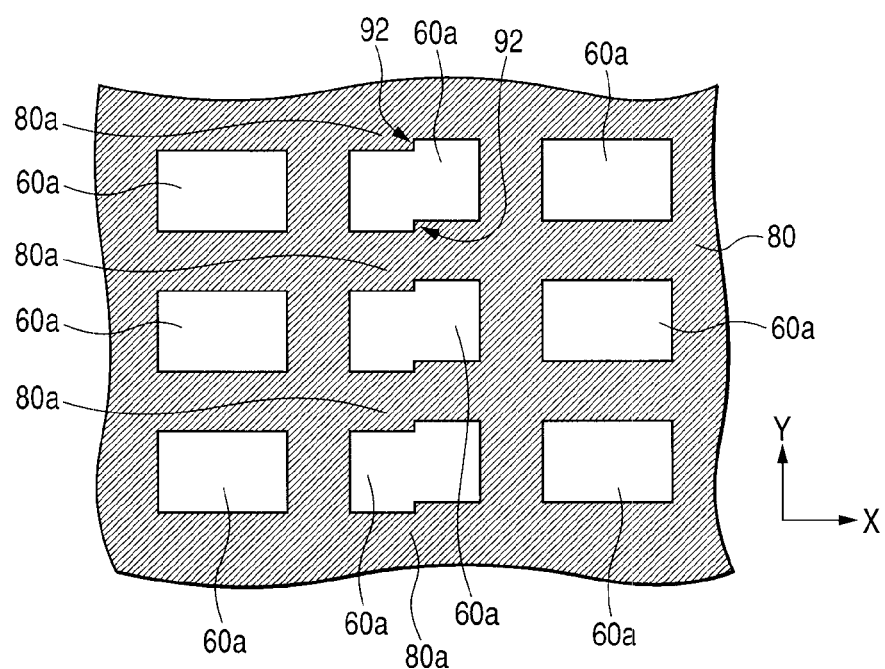
FIG. 4 is a top view illustrating the structure of the pixel according to the embodiment of the present invention.
Figure 5:
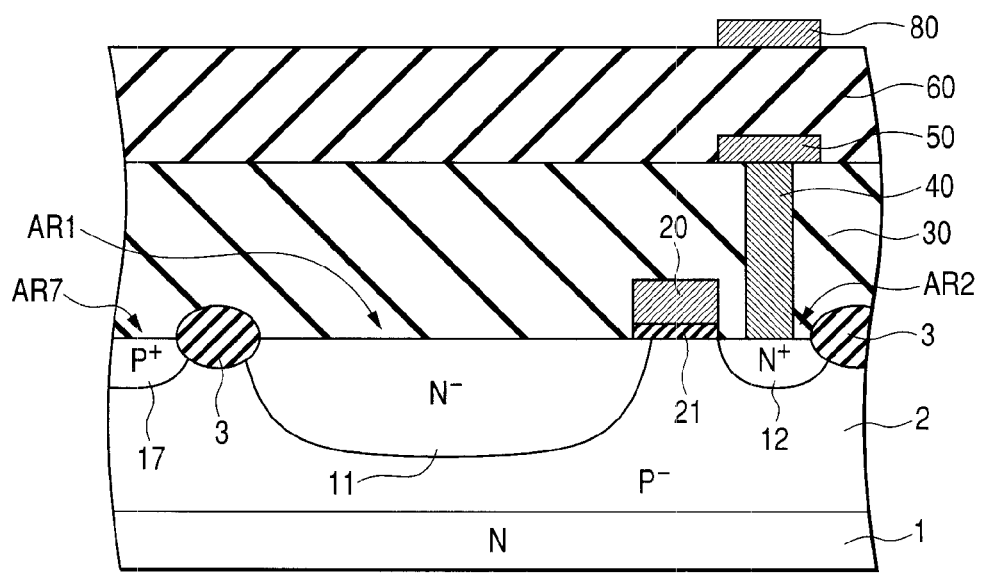
FIG. 5 is a cross-sectional view illustrating the structure of the pixel according to the embodiment of the present invention.

FIGS. 3 and 4 are top views illustrating the structure of the pixel 10. FIG. 5 illustrates the cross-sectional structure taken along an arrow A-A in FIG. 3. For convenience of description, in FIG. 3, only a gate electrode 20 and contact plug 40 are illustrated as the structure above the active regions AR.

As illustrated in FIGS. 3 to 5, a $p^−$ well region 2 is formed in the upper surface of an N type semiconductor substrate 1. Over a well region 2, an element isolation structure 3 for defining active regions AR in the semiconductor substrate 1 is formed. A plurality of pixels 10 are formed in these active regions AR. The element isolation structure 3 is comprised of, for example, a silicon oxide film.

In the upper surface of the well region 2, a $P^+$ type impurity region 17 to which a ground potential GND is to be applied, $N^−$ type impurity region 11, $N^+$ type impurity region 12, and source/drain regions 13 to 16 are formed while being separated from each other. The source/drain regions 13 to 16 are each an $N^+$ type impurity region.

The $N^−$ type impurity region 11 functions as a cathode of the photodiode PD and a source of the transfer transistor TX. The well region 2 forming a PN junction with the $N^−$ type impurity region 11 functions as an anode of the photodiode PD. The $N^+$ type impurity region 12 functions as a drain of the floating diffusion FD and transfer transistor TX. The source/drain region 13 functions as a source of the reset transistor RST. The source/drain region 14 functions as a drain of the reset transistor RST and a drain of the amplified MOS imager transistor AMI. The source/drain region 15 functions as a source of the amplified MOS imager transistor AMI and drain of the select transistor SEL. The source/drain region 16 functions as a source of the select transistor SEL.

Over the well region 2 between the $N^−$ type impurity region 11 and $N^+$ type impurity region 12, a gate electrode 20 of the transfer transistor TX is formed via a gate insulating film 21. Over the well region 2 between the source/drain regions 13 and 14, a gate electrode 20 of the reset transistor RST is formed via the gate insulating film 21. Over the well region 2 between the source/drain regions 14 and 15, a gate electrode 20 of the amplified MOS imager transistor AMI is formed via the gate insulating film 21. Over the well region 2 between the source/drain regions 15 and 16, a gate electrode 20 of the select transistor SEL is formed via the gate insulating film 21. The gate electrode is comprised of, for example, polysilicon and the gate insulating film 21 is comprised of, for example, a silicon oxide film.

Thus, the active regions AR having the pixels 10 formed therein have partial active region AR 1 having the $N^−$ type impurity region 11 formed therein, partial active region AR2 having the $N^+$ type impurity region 12 formed therein, partial active regions AR3 to AR6 having the source/drain regions 13 to 16 formed therein, respectively, and partial active region AR7 having the $P^+$ type impurity region 17 formed therein. In a top view, a region comprised of the partial active regions AR1 and AR2 is isolated from the partial active region AR7 by the element isolation structure 3; a region comprised of the partial active regions AR1 and AR2 is isolated from a region comprised of the partial active regions AR3 to AR6 by the element isolation structure 3; and the partial active region AR7 is isolated from the region comprised of the partial active regions AR3 to AR6 by the element isolation structure 3. The partial active region AR7, the partial active region AR1 and partial active region AR2 are placed in the order of mention along the X axis direction. The partial active regions AR3 to AR6 are placed in the order of mention along the X axis direction. The partial active region AR1 and a region comprised of the partial active regions AR4 to AR6 are placed along the Y axis direction. The partial active region AR2 and the partial active region AR3 are arranged along the Y axis direction.

As illustrated in FIG. 3, the partial active region AR1 in a top view has a substantially rectangular shape and it extends along the X axis direction. Some partial active regions AR1, of the plural partial active regions AR1, which stand in the Y axis direction, that is, the partial active regions AR1 in a certain column have, in a top view, a shape slightly displaced in the Y axis arrow direction in a substantially half of each of two long sides which are opposite to each other in the Y axis direction and are on the side of the partial active region AR2. The two long sides therefore each has a step difference 90.

Of the plural partial active regions AR5, the partial active regions AR5 which stand, in the Y axis direction, adjacent to the partial active regions AR1 having the step difference 90, that is, the partial active regions AR5 belonging to the same column with the partial active regions AR1 having the step difference 90 have, in a top view, a square shape with two sides opposite to each other in the X axis direction and the other two sides opposite to each other in the Y axis direction. They have a shape slightly displaced in the Y axis arrow direction in a substantial half of two sides which are opposite to each other in the Y axis direction and are on the side of the partial active regions AR4. The two sides opposite to each other in the Y axis direction therefore each has a step difference 91.

Thus, the partial active regions AR1 belonging to a certain column have a shape, in a top view, displaced in the Y axis direction so that a step difference 90 appears at the periphery in a top view, while the partial active region AR5 adjacent to the partial active regions AR1 in the Y axis direction have a shape, in a top view, displaced in the Y axis direction so that the step difference 91 appears at the periphery in a top view. These step differences 90 and 91 are formed because, as will be described later, in divided exposure treatment for defining the active regions AR in the semiconductor substrate 1, the exposure dividing line is placed over a region of the semiconductor substrate 1 in which the partial active regions AR1 and AR5 are to be formed.

Of the plural the partial active regions AR5, the partial active regions AR5 other than the partial active regions AR5 having the step difference 91 have a substantially square shape in a top view. The partial active regions AR3, AR4 and AR6 also have a substantially square shape in a top view, while the partial active regions AR7 have, in a top view, a substantially rectangular shape extending along the Y axis direction.

As illustrated in FIG. 5, an interlayer dielectric film 30 is formed over the semiconductor substrate 1 to cover therewith the gate insulating film 21 and gate electrode 20. In the interlayer dielectric film 30, a plurality of contact plugs 40 penetrating the film in the thickness direction thereof are formed. The plural contact plugs 40 are, at one end thereof, brought into contact with the partial active regions AR2 to AR4, AR6 and AR7, respectively. Over the interlayer dielectric film 30, a plurality of lower interconnects 50 are formed in contact with the plural contact plugs 40. Over the interlayer dielectric film 30, an interlayer dielectric film 60 is formed so as to cover the plural interconnects 50 therewith. In the interlayer dielectric film 60, unillustrated via plugs which penetrate the film in the thickness direction thereof are formed. These via plugs are contiguous to some of the interconnects 50. Over the interlayer dielectric film 60, upper interconnects 80 contiguous to the via plugs are formed. The interlayer dielectric films 30 and 60 are each, for example, a silicon oxide film. The contact plugs 40, via plugs and interconnects 50 and 80 are each made of, for example, a metal.

As illustrated in FIG. 4, the upper interconnect 80 has a lattice shape in a top view. Of the interlayer dielectric film 60, a plurality of the partial regions 60a arranged in a matrix over the partial active region AR1 are exposed from the interconnect 80. The interconnect 80 has a shape, in a top view, displaced in the Y axis direction so as to cause a step difference 92 on the side surface. Of the interconnect 80, partial regions 80a which stand, in the Y axis direction, adjacent to the partial regions 60a over the partial active region AR1 having the step difference 90 are slightly displaced in the Y axis direction in a substantial half of both side surfaces opposite to each other in the Y axis direction. The partial regions 80a have therefore, on both side surfaces thereof, step differences 92, respectively. These step differences 92 are also produced so that the exposure dividing line is located over the partial active regions AR1 and AR5 in the divided exposure treatment during the formation of the interconnects 80, which will be described later.

Figure 6:
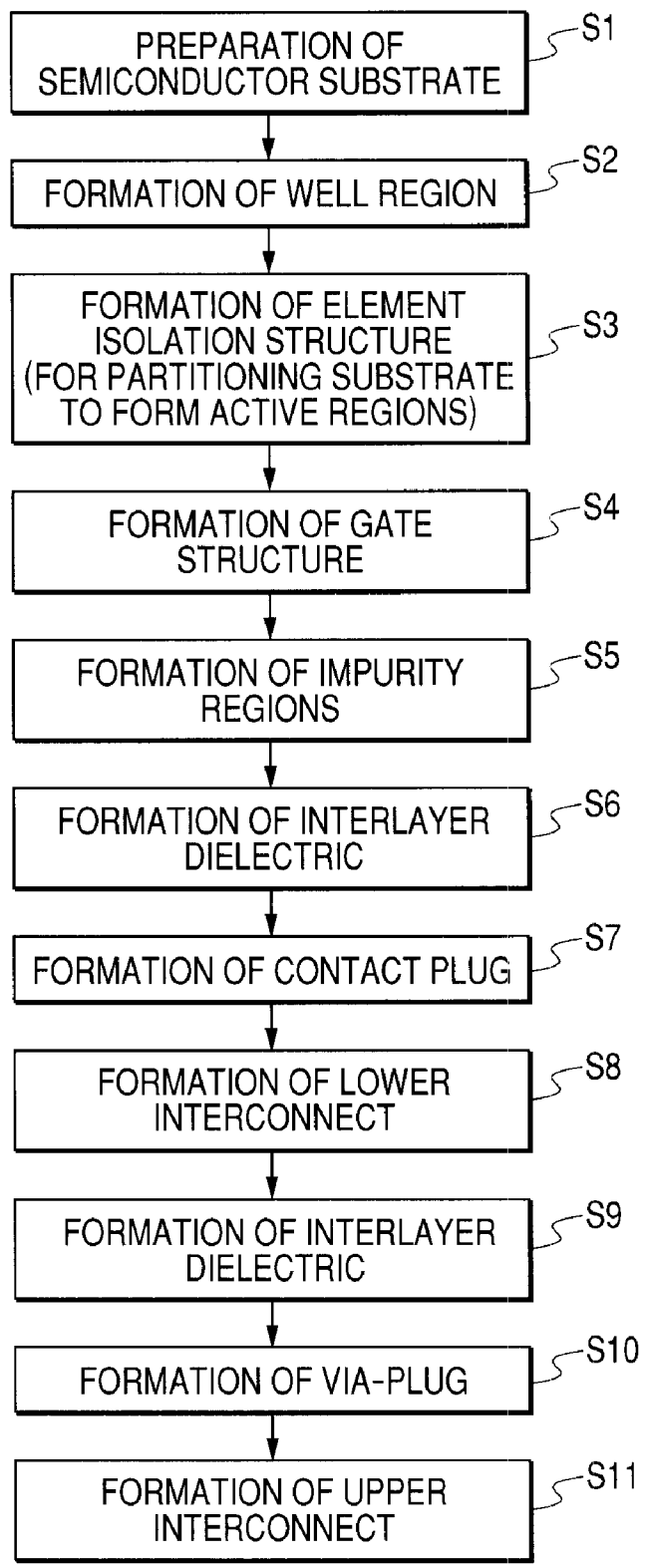
FIG. 6 is a flow chart showing a manufacturing method of the solid-state image sensor according to the embodiment of the present invention.

The manufacturing method of a solid-state sensor according to this embodiment will next be described. FIG. 6 is a flow chart showing the manufacturing method of a solid-state sensor relating to the present embodiment. The description will next be made mainly on the manufacturing method of the pixel 10.

As shown in FIG. 6, a semiconductor substrate 1 which is a semiconductor chip is provided in Step s1 and a well region 2 is formed within the upper surface of the semiconductor substrate 1 in Step s2.

In Step s3, an element isolation structure 3 is then formed on the well region 2 to define, in the semiconductor substrate 1, active regions AR in which a plurality of pixels 10 are to be formed. Simultaneously, active regions in which readout circuits 2 and 3, and output circuit 4 are to be formed are to be formed are defined in the semiconductor substrate 1.

In Step s4, gate structures having a gate insulating film 21 and a gate electrode 20 are formed for each of various MOS transistors including transfer transistor TX, reset transistor RST, amplified MOS imager transistor AMI and select transistor SEL.

In Step s5, various impurity regions such as $N^-$ type impurity region 11, $N^+$ type impurity region 12, source/drain regions 13 to 16, and $P^+$ type impurity region are formed in the upper surface of the well region 2 in the active region AR.

In Step s6, an interlayer dielectric film 30 is formed over the semiconductor substrate 1. In Step s7, a contact plug 40 is formed in the interlayer dielectric film 30. In Step s8, a lower interconnect 50 is formed over the interlayer dielectric film 30.

In Step s9, an interlayer dielectric film 60 is formed over the interlayer dielectric film 30 and in step s10, a via plug is formed in the interlayer dielectric film 60. In Step s11, an upper interconnect 80 is formed over the interlayer dielectric film 60.

Figure 7:
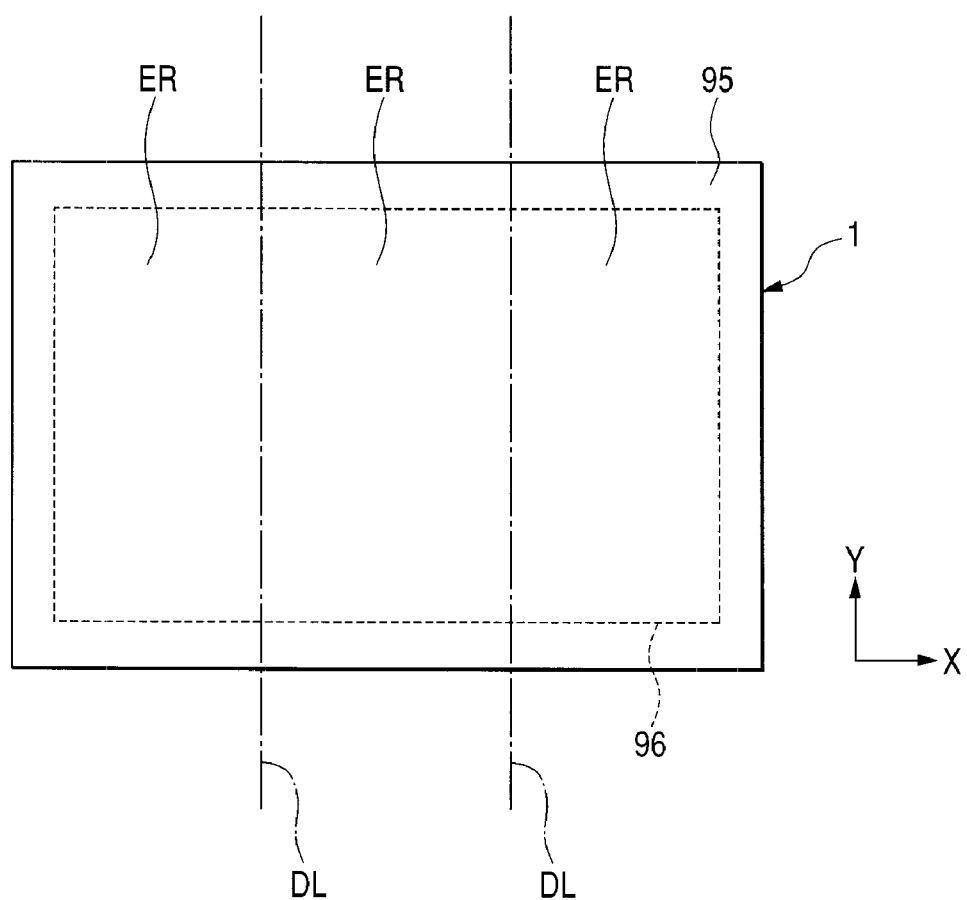
FIG. 7 illustrates divided exposure treatment in the embodiment of the present invention.

In the above-described steps s3 to s5, a photoresist is formed over the semiconductor substrate 1 and is subjected to exposure treatment. The area exposed by single exposure with an exposure apparatus used in the manufacturing method of this Embodiment is smaller than the surface area of the solid-state sensor formed over the semiconductor substrate 1. In this Embodiment, as illustrated in FIG. 7, the photoresist 95 formed over the semiconductor substrate 1 is divided into a plurality of exposure regions ER, for example, three exposure regions ER and exposure treatment is given to each of these three exposure regions ER. Accordingly, in this Embodiment, there exist two dividing lines DL for three exposure regions ER. In this Embodiment, by properly setting the positions of the dividing lines DL for performing divided exposure, deterioration in performance of the solid-state sensor, which will otherwise occur by the misalignment of two mask patterns used respectively for exposure of two adjacent exposure regions ER. A broken line 96 in FIG. 7 shows a region of the semiconductor substrate 1 in which a pixel array portion 1 is to be formed.

Figure 8:
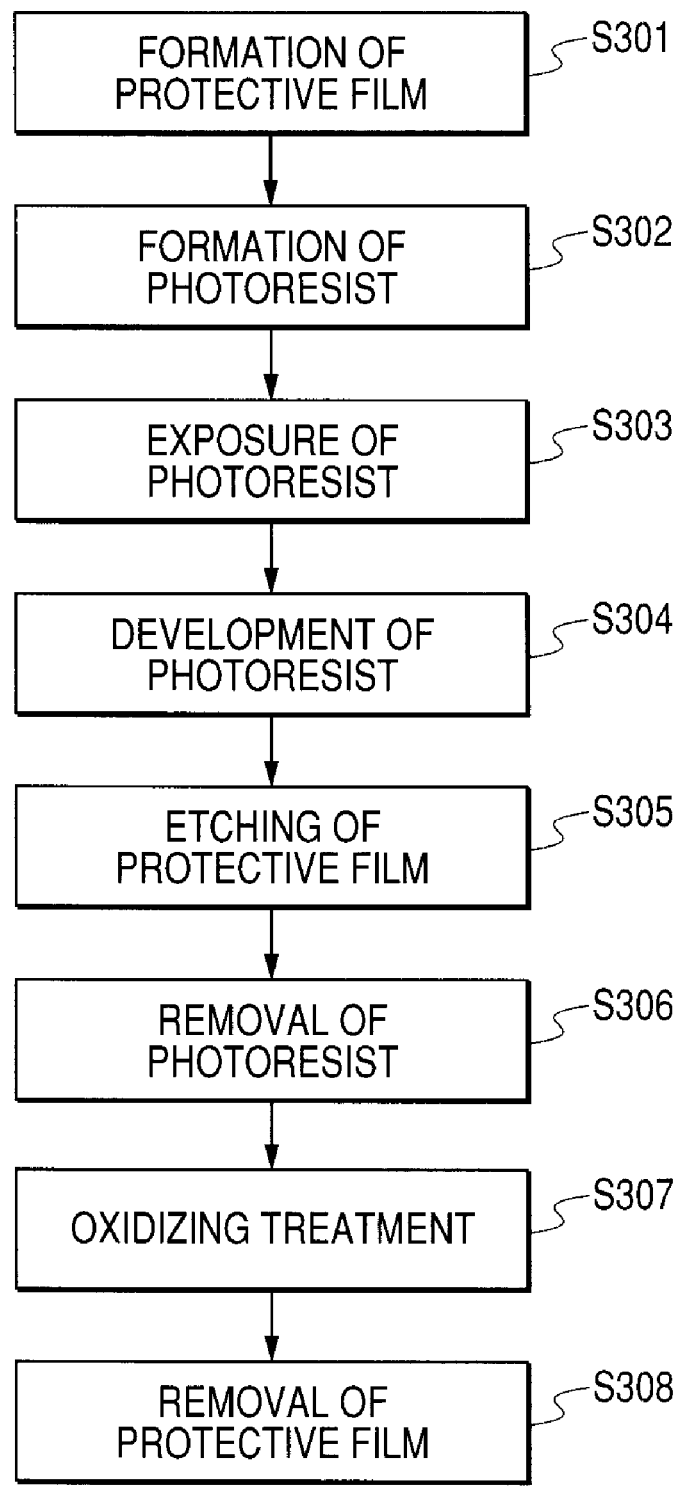
FIG. 8 is a flow chart showing a manufacturing method of an element isolation structure according to the embodiment of the present invention.

FIG. 8 is a flow chart showing formation steps of the element isolation structure 3 in Step s3 in detail. FIG. 8 shows a flow when the element isolation structure 3 made of a silicon oxide film is formed by an LOCOS (local oxidation of silicon) system. Alternatively, the element isolation structure 3 may be formed by an STI (shallow trench isolation) system. First, as illustrated in FIG. 8, a protective film 99 having a stack structure of a silicon oxide film and a silicon nitride film is formed over the semiconductor substrate 1 in Step s301. In Step s302, a photoresist 100 is then formed over the protective film 99.

Figure 9:
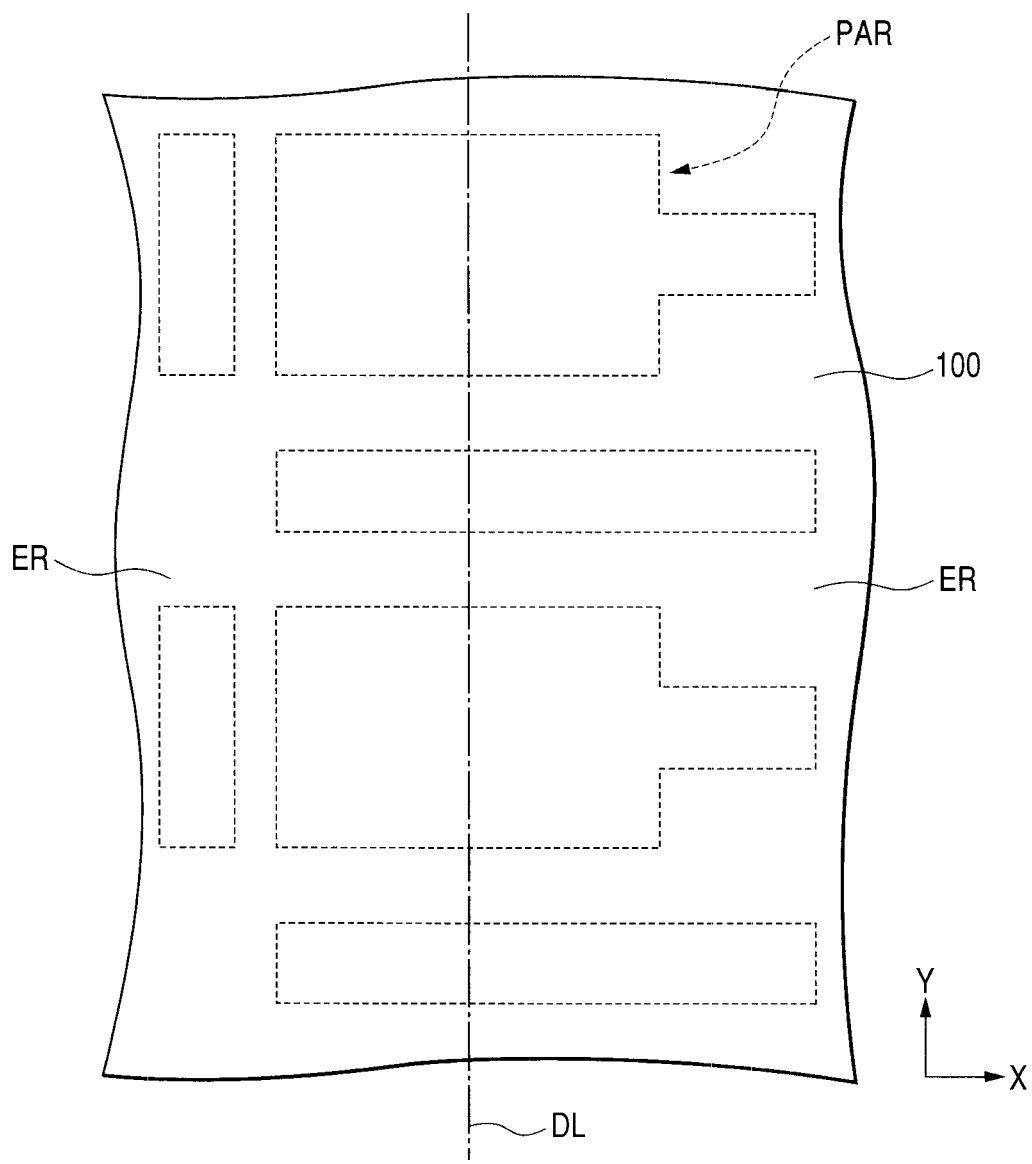
FIG. 9 is a top view illustrating a manufacturing step of the element isolation structure according to the embodiment of the present invention.

In Step s303, the photoresist 100 is exposed through a photomask having a predetermined mask pattern formed therein. In this step, the photoresist 100 is subjected to divided exposure. FIG. 9 shows the way how the divided exposure is performed in Step s303. As illustrated in FIG. 9, the dividing line DL for divided exposure in the photoresist 100 is located at least over the region PAR of the semiconductor substrate 1 in which the active regions AR are to be formed. More specifically, the dividing line DL linearly extends along the Y axis direction over a portion, of the region PAR of the semiconductor substrate 1 in which the active regions AR are to be formed, in which an N⁻ type impurity region 11 and a source/drain region 15 of a plurality of pixels 10 belonging to a certain column are to be formed.

In this Embodiment, as described above, the photoresist 100 is divided into three exposure regions ER. These three exposure regions ER are subjected to exposure treatment, respectively. Mask patterns corresponding to these three exposure regions ER are provided for this exposure. In other words, three mask patterns are therefore used in the exposure treatment in Step s303.

Figure 10:
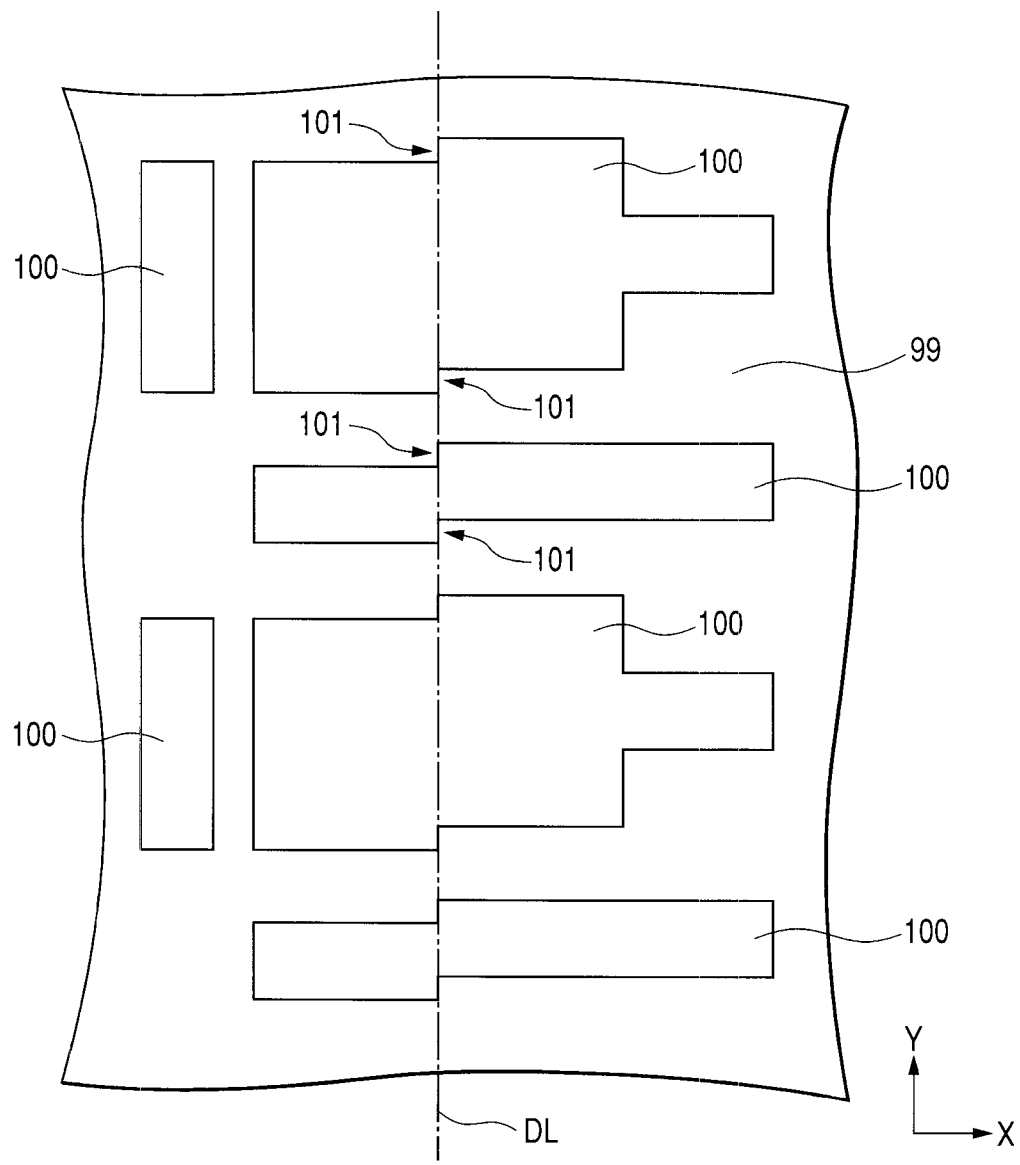
FIG. 10 is a top view illustrating a manufacturing step of the element isolation structure according to the embodiment of the present invention.

After Step s303, the photoresist 100 after exposure is developed in Step s304 and the resulting photoresist 100 is patterned. FIG. 10 is a top view illustrating the photoresist 100 after patterning. As illustrated in FIG. 10, the resist pattern of the patterned photoresist 100 is displaced in the Y axis direction between two adjacent exposure regions ER with the dividing line DL as a boundary. This occurs because misalignment occurs in the Y axis direction between two mask patterns used respectively for exposure of two adjacent exposure regions ER of the photoresist 100. As a result, a step difference 101 appears on the side surface of the photoresist 100 with the dividing line DL for divided exposure as a boundary.

In Step s305, with the photoresist 100 as a mask, the protective film 99 exposed from the photoresist 100 is etched off. In step s306, the photoresist 100 used as the mask is then removed. In Step s307, the structure thus obtained is subjected to oxidation treatment. The portion of the semiconductor substrate 1 on which the protective film 99 has been formed is not oxidized and only the portion exposed from the protective film 99 is oxidized. By this treatment, the element isolation structure 3 for defining the active regions AR is formed in the semiconductor substrate 1. Then, the protective film 99 used as a mask is removed in Step s308.

Figure 11:
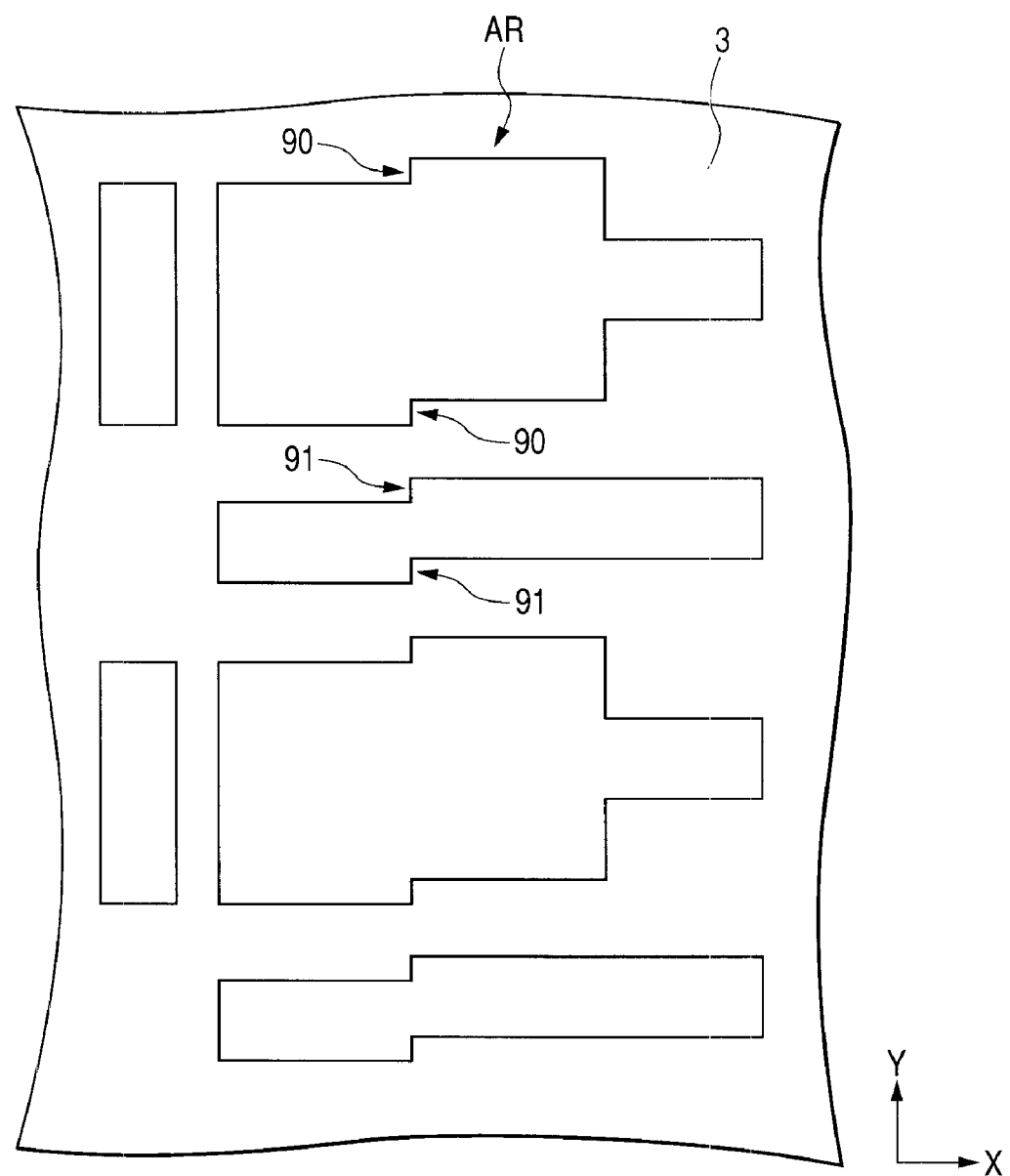
FIG. 11 is a top view illustrating a manufacturing step of the element isolation structure according to the embodiment of the present invention.

FIG. 11 is a top view illustrating the structure obtained after Step s308. As illustrated in FIG. 11, in a partial active region AR1, of the active regions AR, in which the N⁻ type impurity region 11 of each of the plural pixels 10 of a certain column is to be formed, a step difference 90 is formed at the periphery, in a top view, according to the step difference 101 formed on the side surface of the photoresist 100. In a partial active region AR5, of the active regions AR, in which the source/drain region 15 of each of the plural pixels 10 of the certain column is to be formed, a step difference 91 is formed at the periphery, in a top view, according to the step difference 101 formed on the side surface of the photoresist 100.

Figure 12:
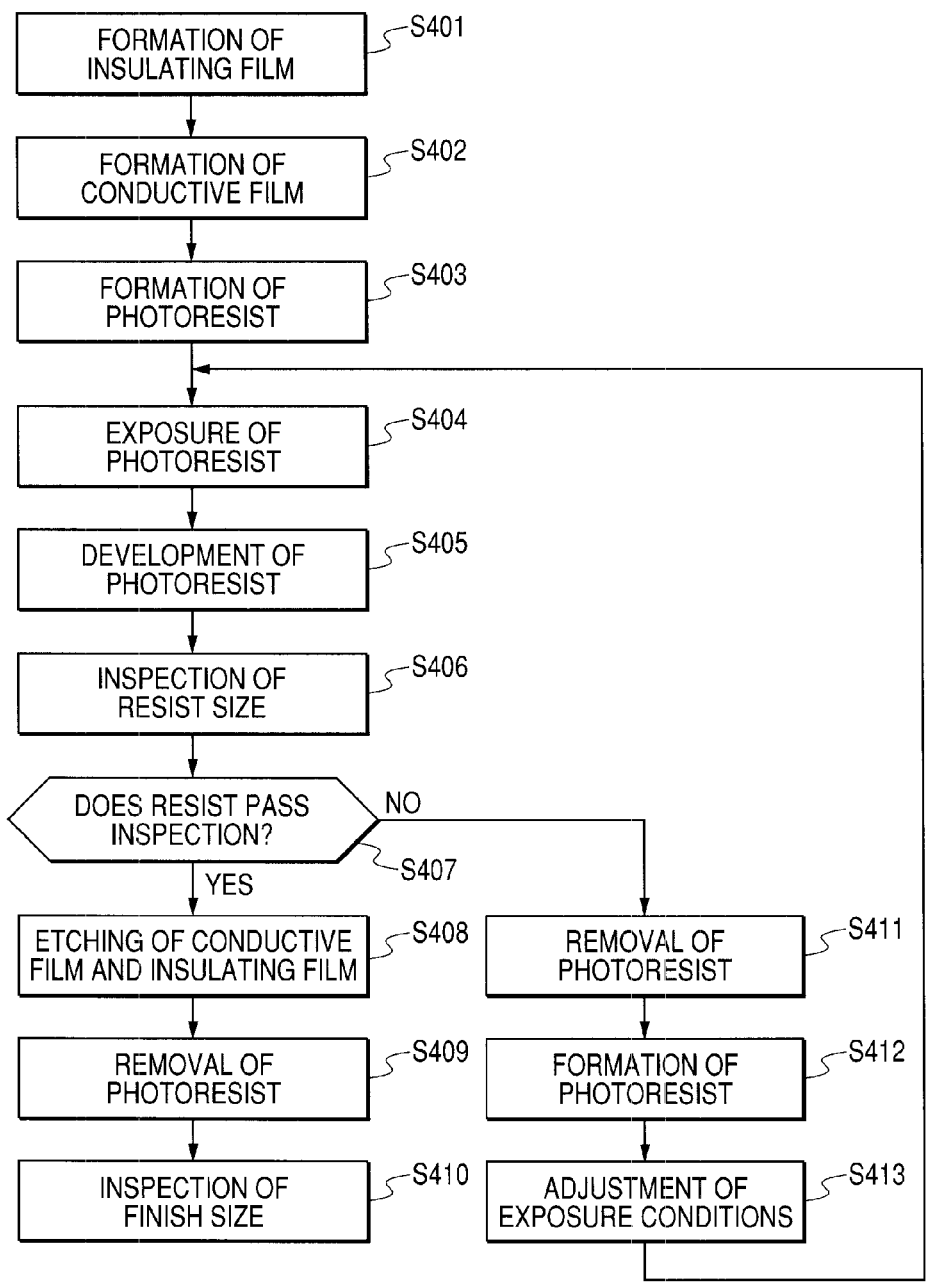
FIG. 12 is a flow chart showing a manufacturing method of a gate structure according to the embodiment of the present invention.

FIG. 12 shows a flow chart illustrating a step of forming a gate structure in Step s4 in detail. In step s401, as illustrated in FIG. 12, an insulating film which will be a gate insulating film 21 is formed over the semiconductor substrate 1. Then, in Step s402, a conductive film 210 which will be as a gate electrode 20 is formed over the insulating film.

Figure 13:
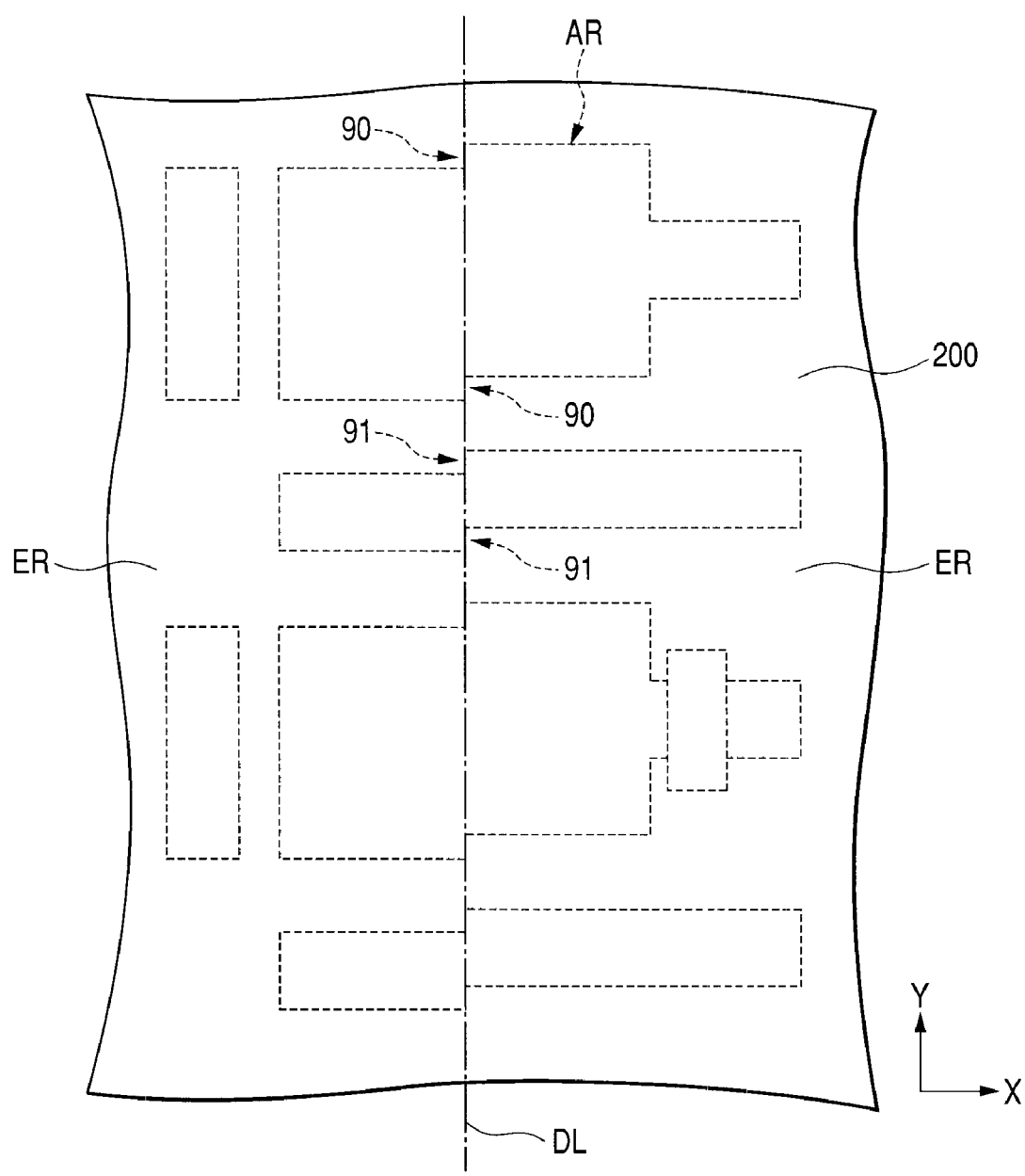
FIG. 13 is a top view illustrating a manufacturing step of the gate structure according to the embodiment of the present invention.

In Step s403, a photoresist 200 is formed over the conductive film 210. In Step s404, the photoresist 200 is exposed using a photomask having a predetermined mask pattern formed therein. During this exposure, the photoresist 200 is subjected to divided exposure treatment. FIG. 13 illustrates the way how the divided exposure treatment is performed in Step s404. As illustrated in FIG. 13, a dividing line DL of the photoresist 200 for divided exposure is set at the same position as that of the dividing line DL for the divided exposure in the above-described step s303. This means that, in Step s404, the dividing line DL is located over a portion of the active regions AR in which the N⁻ type impurity region 11 and source/drain region 15 of each of a plurality of pixels 10 of a certain column are to be formed. In Step s404, similar to Step s303, the photoresist 200 is divided into three exposure regions ER and these three exposure regions ER are subjected to exposure treatment, respectively.

Figure 14:
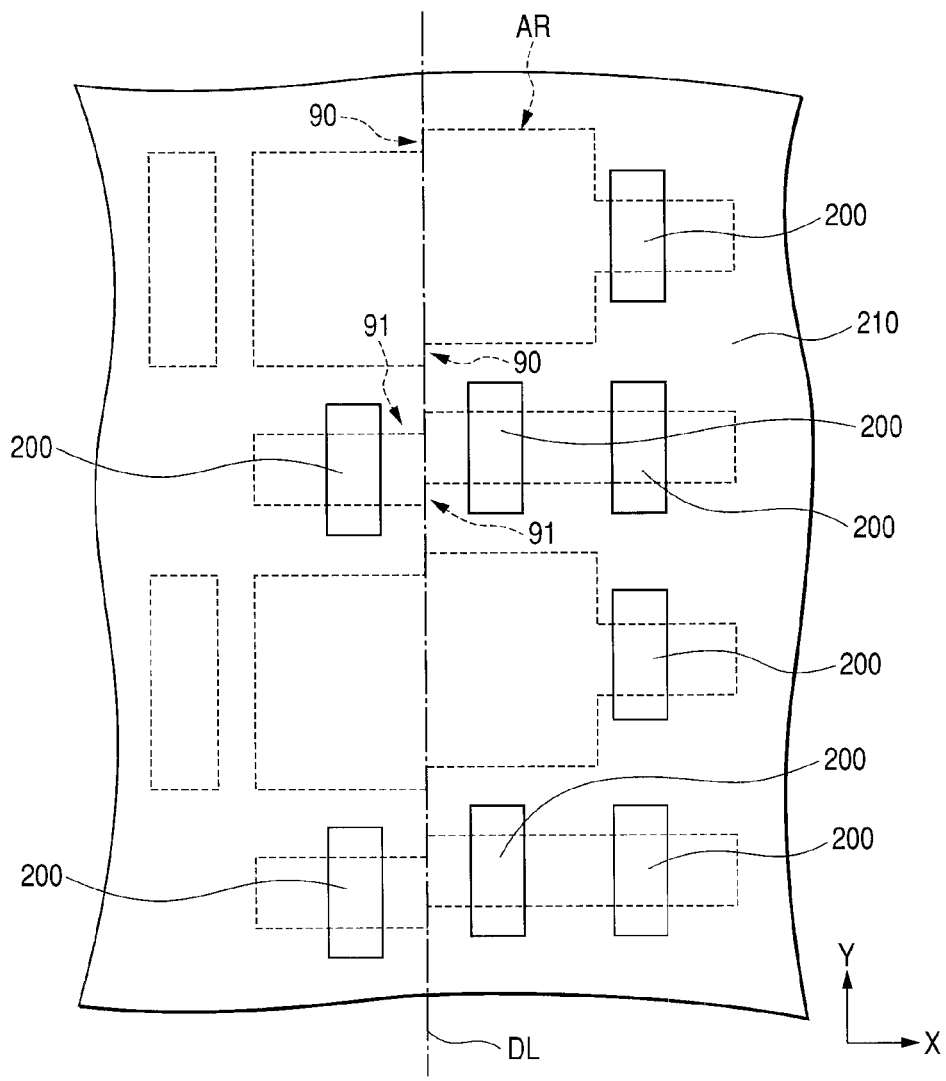
FIG. 14 is a top view illustrating a manufacturing step of the gate structure according to the embodiment of the present invention.

In subsequent Step s405, the photoresist 200 after exposure is developed and the resulting photoresist 200 is then patterned. FIG. 14 is a top view illustrating the patterned photoresist 200. As illustrated in FIG. 14, the photoresist 200 having a shape corresponding to the shape of the gate insulating film 21 and gate electrode 20 is formed over the conductive film 210.

Figure 15:
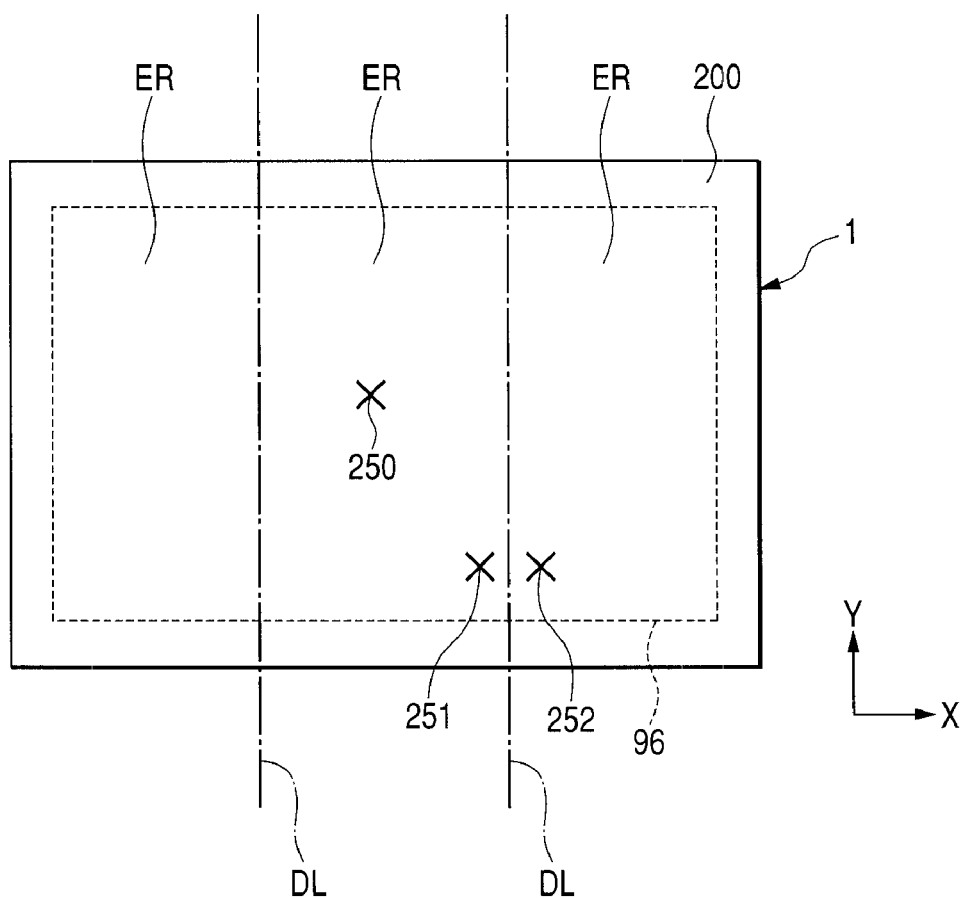
FIG. 15 is a top view illustrating a manufacturing step of the gate structure according to the embodiment of the present invention.

In subsequent Step s406, size inspection of the resist pattern formed in Step s405 is performed. FIG. 15 is a diagram for explaining the size inspection. In this Embodiment, the photoresist is subjected to divided exposure treatment. Exposure treatment for a certain exposure region ER and exposure treatment for another exposure region ER are not performed simultaneously so that two or more mask patterns are used. Owing to errors upon setting exposure conditions, designing mask patterns and the like, resist patterns of the patterned photoresist which must essentially be equal sometimes are not the same between the two adjacent exposure regions ER. As a result, in the semiconductor substrate 1, the device size sometimes differs between two regions having the dividing line DL therebetween. For example, a difference in the size of the gate electrode 20 between these two regions may lead to a difference in a charge transfer ability of a transfer transistor TX or a readout speed of data from the pixel 10 between these two regions. Further, it causes a difference in the coupling capacitance between the gate electrode 20 and floating diffusion FD, resulting in difference in pixel properties and causing deterioration in image quality. Accordingly, in the photoresist subjected to divided exposure, it is very important to manage the size of the resist patterns of each of two adjacent exposure regions ER.

In Step s406, as illustrated in FIG. 15, the size of a resist pattern at a predetermined position 251 of one of two exposure regions ER having a dividing line DL therebetween and the size of a resist pattern at a predetermined position 252 of the other one of the two exposure regions ER are measured and these two sizes are compared. In Step s406, the size of the resist pattern corresponding to the shape of the gate electrode 20 in each of the two adjacent exposure regions ER is measured. In this Embodiment, there are two dividing lines DL so that two exposure regions ER having one of these dividing lines DL sandwiched therebetween and two exposure regions ER having the other one of these two dividing lines DL sandwiched therebetween are subjected to size inspection, respectively. The predetermined positions 250 and 251 are positions set as near as possible to the boundary line DL.

Even in one exposure region ER of the photoresist 200, light irradiated thereto is not uniform and there may occur a difference in the size of the resist pattern within one exposure region ER of the patterned photoresist 200. In particular, during exposure of one exposure region ER, another exposure region ER adjacent thereto is covered with a light-shielding film so that the resist patterns which must essentially be equal may differ greatly between the center portion and a portion near the dividing line DL within the one exposure region ER.

In Step s406, in each of exposure regions ER of the patterned photoresist 200, the size of the resist pattern at the predetermined position 250 at the center of the ER and the size of the resist pattern at the predetermined position 251 near the dividing line DL are measured and two sizes thus measured are compared. In this Embodiment, the photoresist 200 is divided into three exposure regions ER so that the size of a resist pattern is inspected in the above-described manner for each of the three exposure regions ER.

The size measurement of the resist pattern in Step s406 is performed using, for example, a scanning electron microscope (SEM). At this time, it is necessary to know the position of the dividing line DL for divided exposure in order to specify the predetermined positions 250 to 252 which are measurement positions of the resist pattern. In this Embodiment, the position of the dividing line DL is found by detecting the step differences 90 and 91 formed in the active regions AR via a scanning electron microscope. In the active regions AR relating to this Embodiment, the step differences 90 and 91 are formed according to the positions of the dividing lines DL for divided exposure so that detection of the step differences 90 and 91 facilitate finding of the position of the dividing line DL. Over the active regions AR, an insulating film which will be the gate insulating film 21 and a conductive film 210 which will be the gate electrode 20 are formed. These films are relatively thin so that the step differences 90 and 91 in the active regions AR can be detected using a scanning electron microscope. The height of the step differences 90 and 91 is preferably 0.03 µm or greater in order to detect the step differences 90 and 91 via a scanning electron microscope. The performance of the solid-state sensor may deteriorate when the step differences 90 and 91 are excessively high so that the height of the step differences 90 and 91 is desirably 0.3 µm or less.

In subsequent Step s407, based on the comparison results of the size of the resist pattern in Step s406, the resist pattern formed in the photoresist 200 is judged whether it passes or fails the size inspection. In other words, the patterned photoresist 200 is judged whether it is as designed or not.

Figure 16:
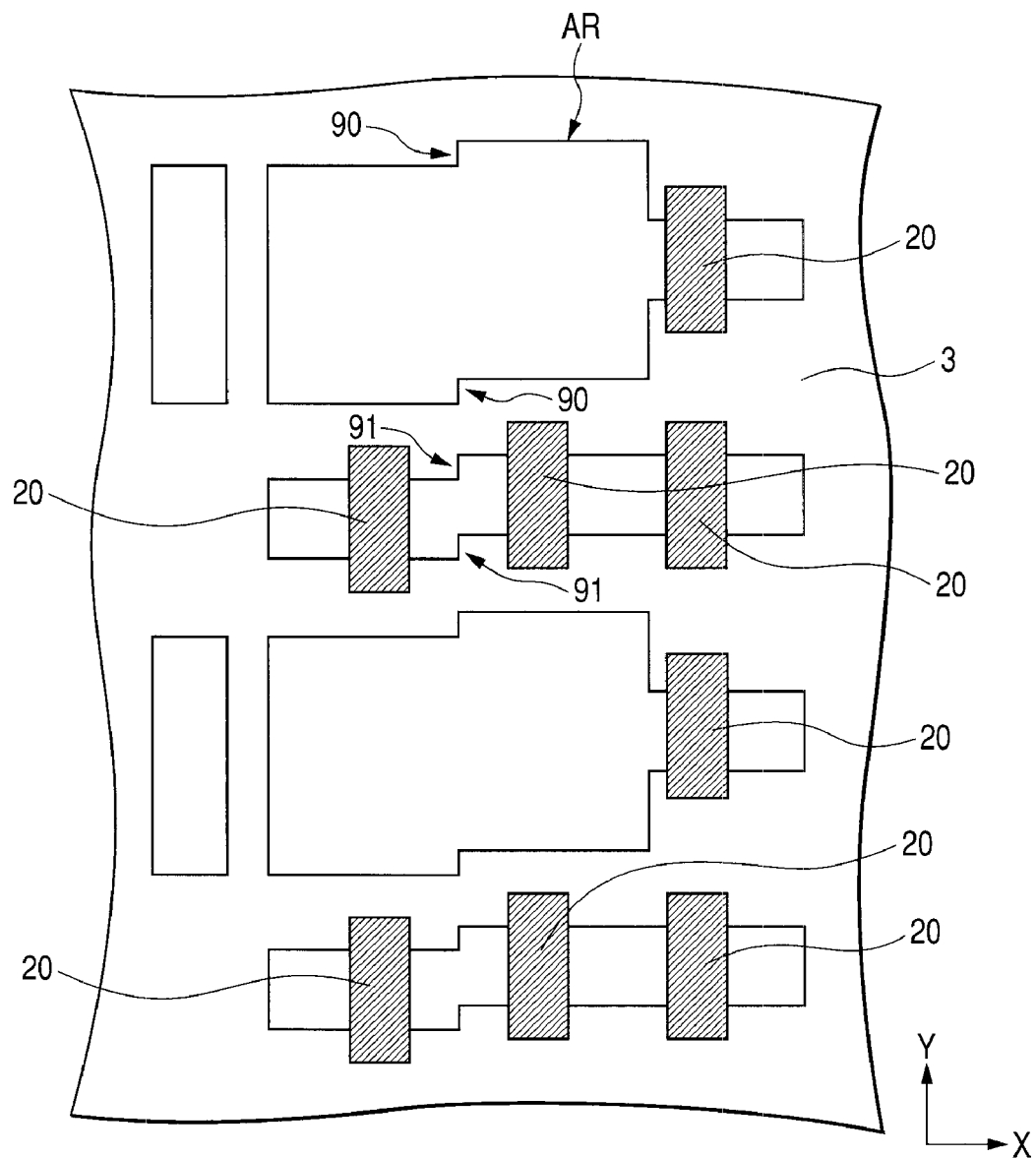
FIG. 16 is a top view illustrating a manufacturing step of the gate structure according to the embodiment of the present invention.

When the resist pattern is determined to pass the size inspection in Step s407, the conductive film 210 and then, the insulating film therebelow exposed from the photoresist 200 are etched off successively by using the photoresist 200 as a mask in Step s408. In subsequent Step s409, the photoresist 200 used as the mask is removed, whereby, as illustrated in FIG. 16, the gate electrodes 20 and gate insulating film 21 of the transfer transistor TX, reset transistor RST, amplified MOS imager transistor AMI, and select transistor SEL are formed.

In subsequent step s410, the size inspection of the gate electrode 20 which has been completed is performed. As described above, gate electrodes 20 of two regions having a dividing line DL therebetween which must essentially be equal in size are sometimes different on the semiconductor substrate 1. In Step s410, in a region, over the semiconductor substrate 1, in which the gate electrode 20 is formed, the gate electrode 20 of one of two partial regions corresponding to two exposure regions having a dividing line DL therebetween and the gate electrode 20 of the other partial region are measured for their sizes and two sizes thus measured are compared. In this Embodiment, there are two dividing lines DL so that the size of the gate electrode 20 is measured in each of two partial regions corresponding to two exposure regions ER having one of the two dividing lines DL therebetween, while the size of the gate electrode 20 is measured in each of two partial regions corresponding to two exposure regions ER having the other dividing line DL therebetween.

Further, since the size of the resist pattern which must essentially be uniform between the center portion and the portion near the dividing line DL within one exposure region ER of the photoresist 200 sometimes differs, the gate electrode 20 which must essentially be uniform in size may also differ in size between a center portion and a portion near the dividing line DL in a partial region corresponding to one of exposure regions ER in the region, over the semiconductor substrate 1, in which the gate electrode 20 is formed. In Step s410, in the partial region corresponding to one of exposure regions ER in the region, over the semiconductor substrate 1, in which the gate electrode 20 is formed, the size of the gate electrode 20 at the center portion and the size of the gate electrode 20 at a position near the dividing line DL are measured and these two sizes thus measured are compared. In this Embodiment, since the photoresist 200 is divided into three exposure regions ER, such size inspection of the gate electrode 20 is performed in each of three partial regions corresponding to three exposure regions ER in the region, over the semiconductor substrate 1, in which the gate electrode 20 is formed.

Based on the results of the size comparison of the gate electrode 20, it is determined whether to continue or terminate the subsequent manufacturing steps. When the difference in the size of the gate electrode 20 is large, the manufacture of the solid-state sensor is terminated, while when it is small, the subsequent manufacturing steps are performed. The results of the size comparison in Step s410 are taken into consideration when exposure conditions in manufacturing a solid-state sensor of the next lot are determined. In other words, when the solid-state sensor of the next lot is manufactured, exposure conditions are adjusted so as to minimize the difference in the size of the gate electrode 20.

When it is determined in Step s407 that the resist pattern fails the size inspection, the patterned photoresist 200 is removed in Step s411 and a new photoresist 200 is formed over the conductive film 210 in step s412. In Step s413, based on the comparison results of the size of the resist pattern in Step s406, exposure conditions for the new photoresist 200 are adjusted. In Step s413, the difference in the size of the resist pattern is minimized, for example, by adjusting the exposure energy. Then, the step s404 is performed again under thus adjusted exposure conditions, followed by similar treatment.

Figure 17:
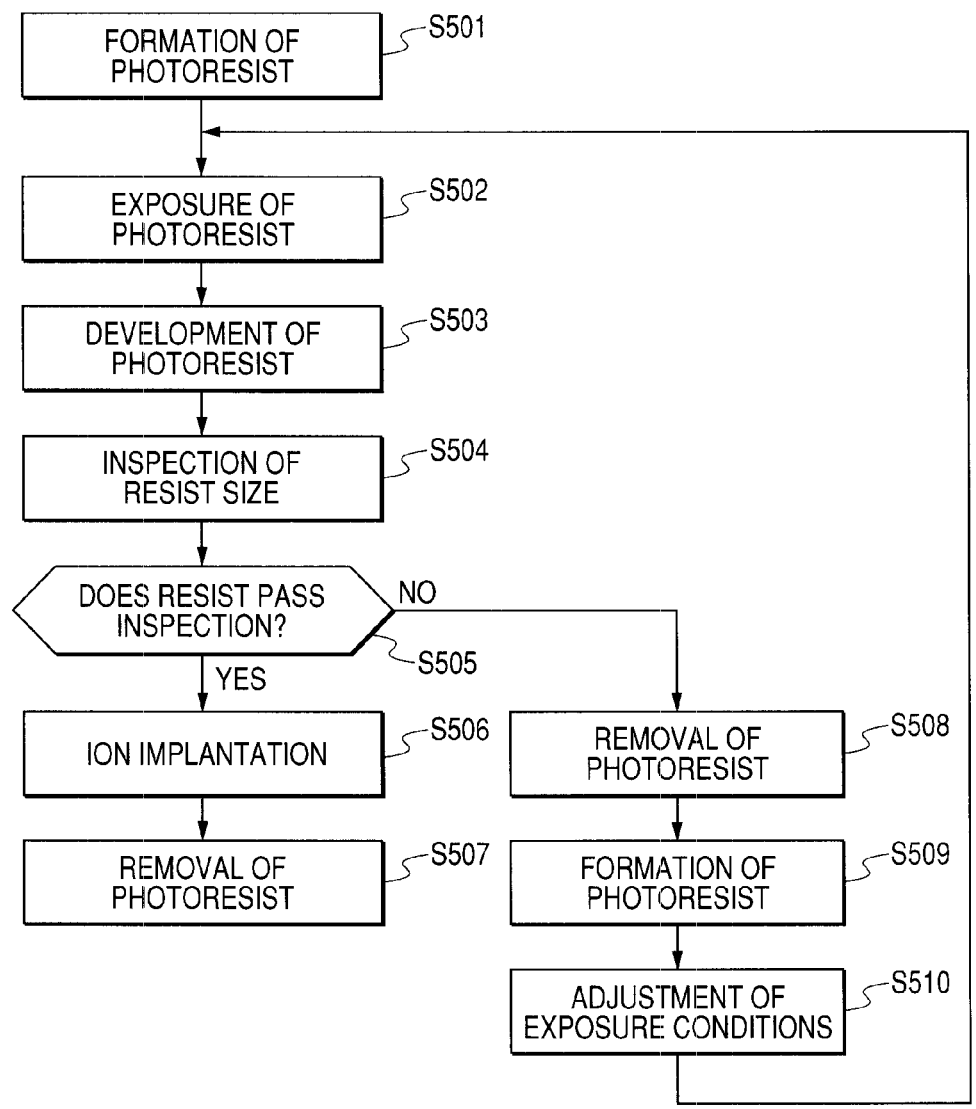
FIG. 17 is a flow chart showing a manufacturing method of an impurity region according to the embodiment of the present invention.

FIG. 17 is a flow chart showing, in detail, the step of forming various impurity regions in Step s5. A step of forming the N⁻ type impurity region 11 will next be described as a typical example.

Figure 18:
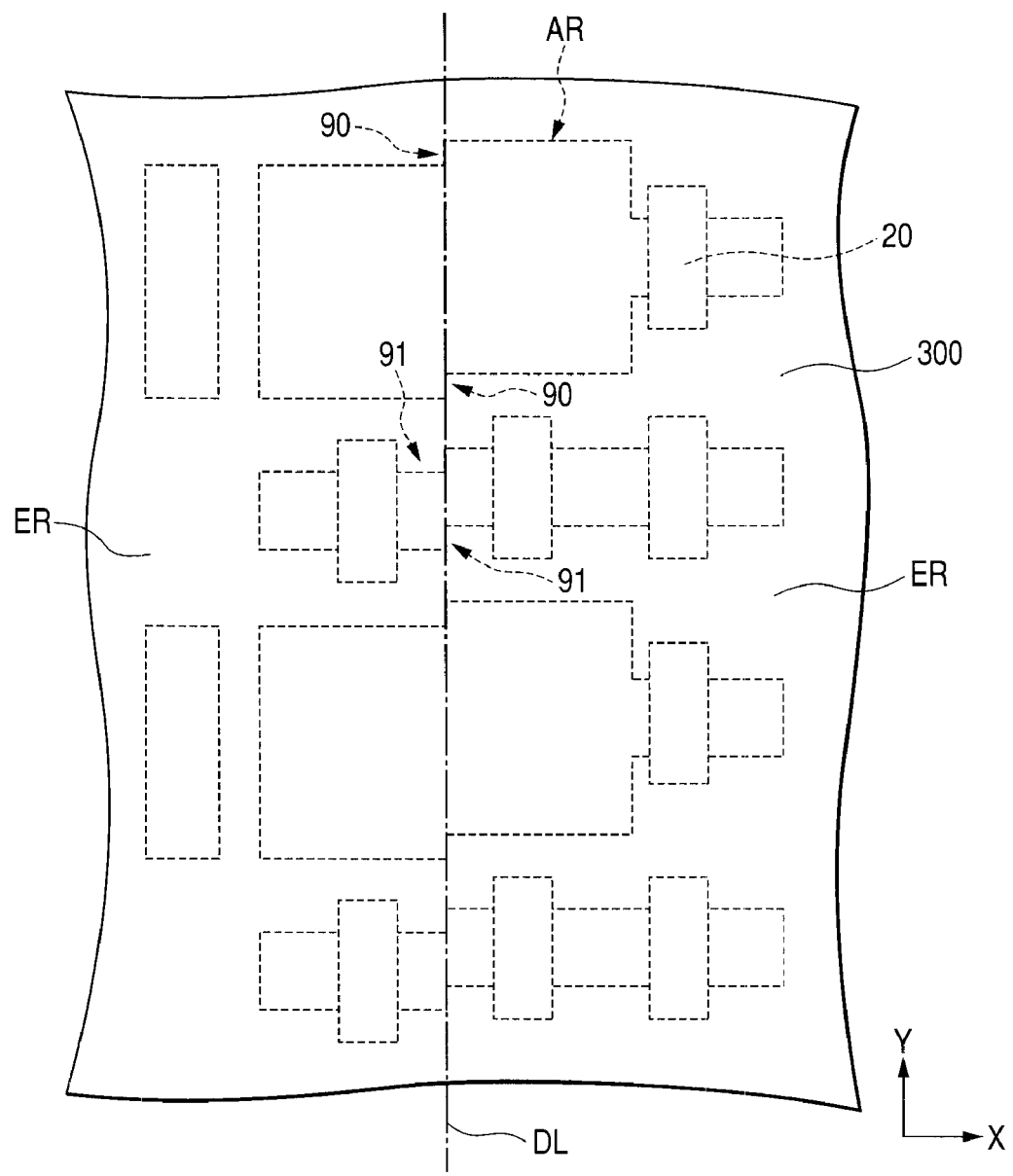
FIG. 18 is a top view illustrating a manufacturing step of the impurity region according to the embodiment of the present invention.

As illustrated in FIG. 17, a photoresist 300 is formed over the semiconductor substrate 1 in Step s501. In subsequent Step s502, the photoresist 300 is exposed using a photomask having a predetermined mask pattern formed therein. During exposure, the photoresist 300 is subjected to divided exposure treatment. FIG. 18 illustrates the way how the divided exposure treatment is performed in Step s502. As illustrated in FIG. 18, a dividing line DL for divided exposure in the photoresist 300 is set at the same position as that of the dividing line DL for divided exposure in the above-described Steps s303 and s304. This means that in Step s502, the dividing line DL is located over regions, of active regions AR, in which an N⁻ type impurity region 11 and source/drain region 15 of a plurality of pixels 10 of a certain column are to be formed. In Step s502, the photoresist 300 is divided into three exposure regions ER as in Steps s303 and s404, and each of these three exposure regions is subjected to exposure treatment.

Figure 19:
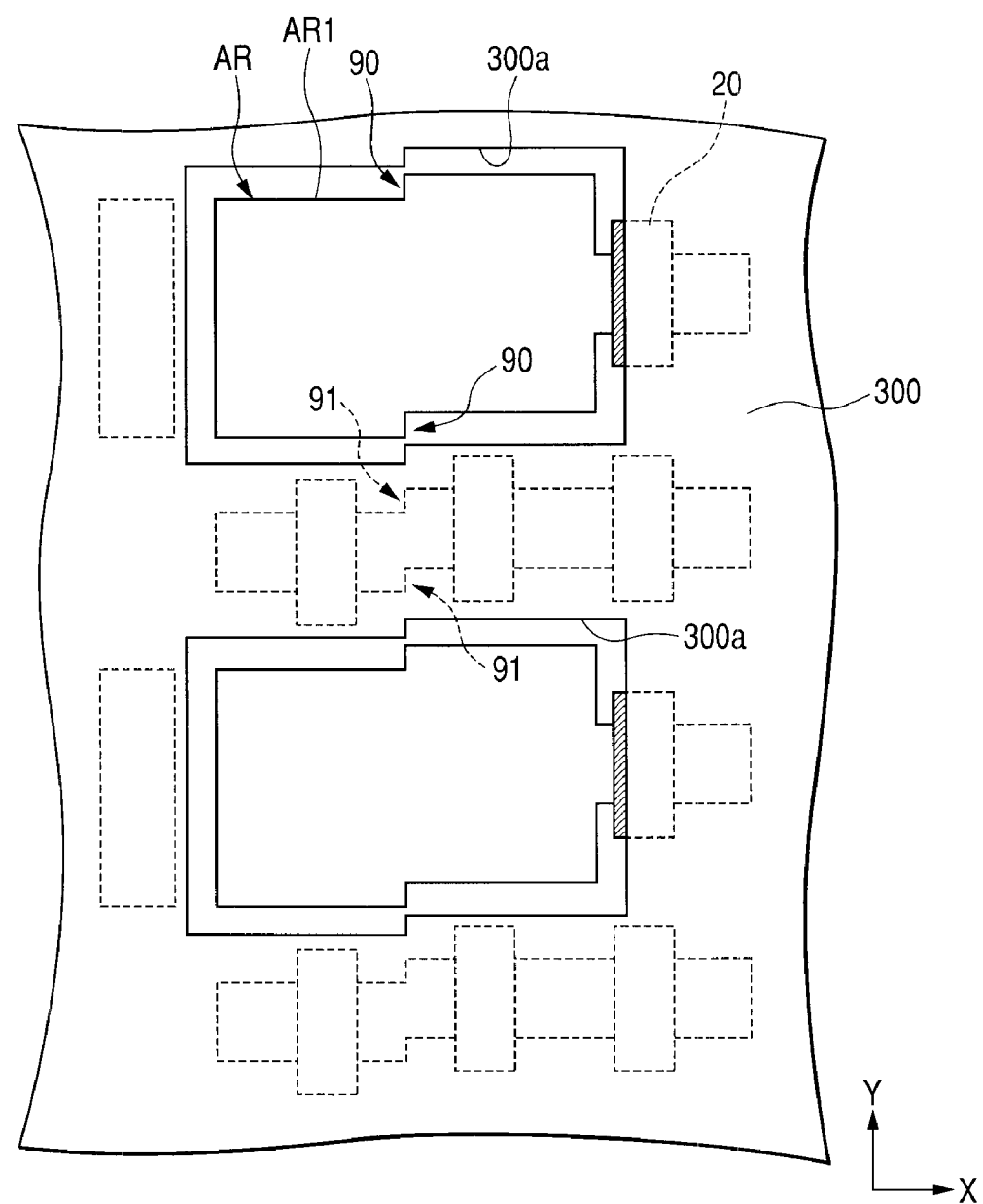
FIG. 19 is a top view illustrating a manufacturing step of the impurity region according to the embodiment of the present invention.

In Step s503, the photoresist 300 after exposure is developed and the resulting photoresist 300 is then patterned. FIG. 19 is a top view illustrating the patterned photoresist 300. As illustrated in FIG. 19, the photoresist 300 having an opening portion 300a for exposing therefrom some partial active regions AR1 is formed over the semiconductor substrate 1.

In Step s504, the size inspection of the resist pattern formed in Step s503 is performed as in the above-described Step s406. In this step, in order to find whether the exposure area of the partial active region AR1 is appropriate or not, the size of the opening portion 300a formed in the photoresist 300 is measured. At this time, the position of a dividing line DL is confirmed by detecting step differences 90 and 91 formed in the active regions AR as in Step s406.

Figure 20:
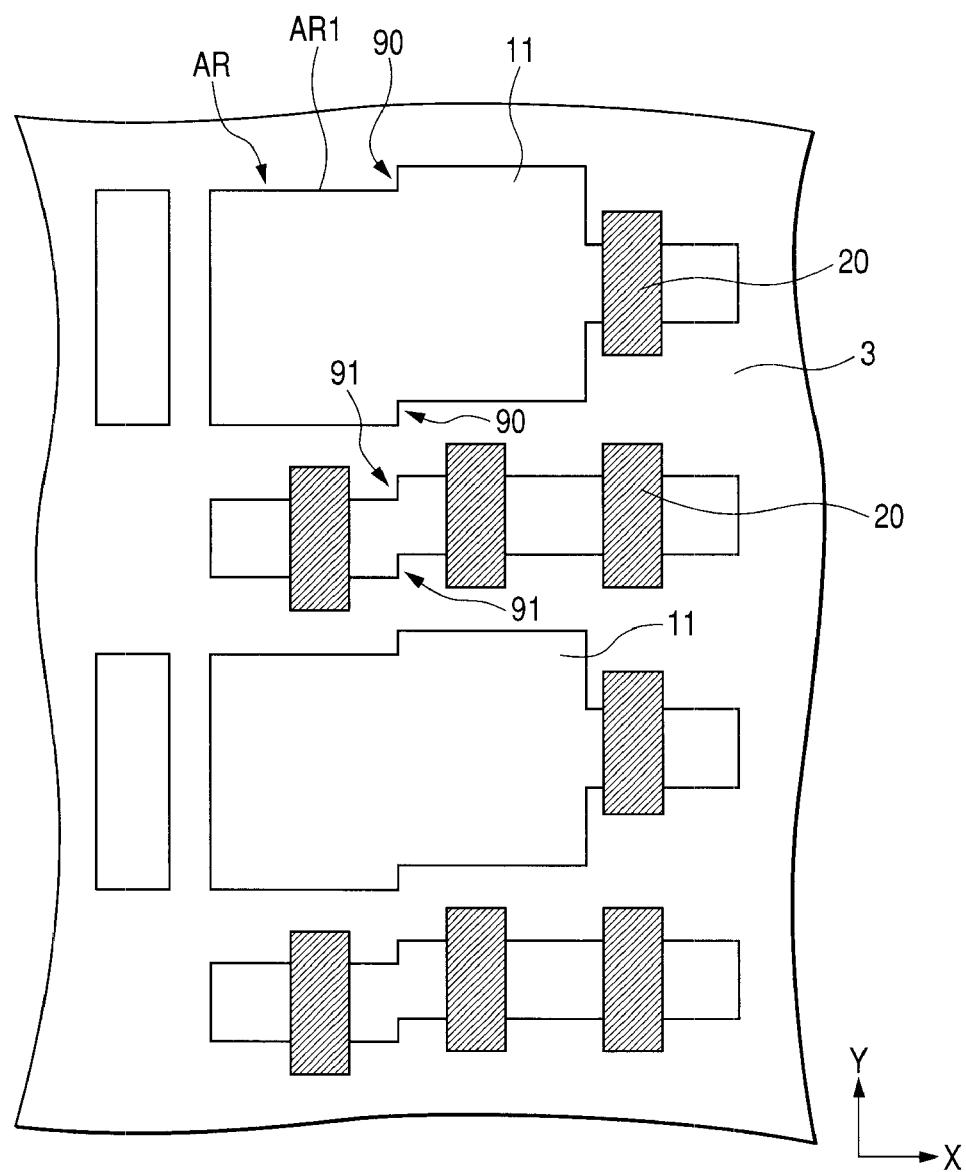
FIG. 20 is a top view illustrating a manufacturing step of the impurity region according to the embodiment of the present invention.

In subsequent Step s505, based on the comparison results of the size of the resist pattern in Step s504, it is determined whether the size of the resist pattern formed in the photoresist 300 passes or fails the size inspection. When the resist pattern is determined to pass the size inspection in Step s505, an N type impurity is introduced, with the photoresist 300 as a mask, into the partial active region AR1 exposed from the photoresist 300 by using, for example, ion implantation. Then, in Step s507, the photoresist 300 used as the mask is removed. As a result, as illustrated in FIG. 20, the N$^-$ type impurity region 11 is formed in the partial active region AR1 of the active regions AR.

When the resist pattern does not pass the size inspection in Step s505, on the other hand, the patterned photoresist 300 is removed in Step s508 and a new photoresist 300 is formed over the semiconductor substrate 1 in Step s509. In Step s510, based on the comparison results of the size of the resist pattern in step s505, exposure conditions are adjusted for the new photoresist 300. In Step s510, for example exposure energy is adjusted. Then, Step s502 is performed again under the thus adjusted exposure conditions, followed by similar treatments as described above.

The N$^+$ type impurity region 12, source/drain regions 13 to 16, and P$^+$ type impurity region 17 are formed by similar treatments.

Figure 21:
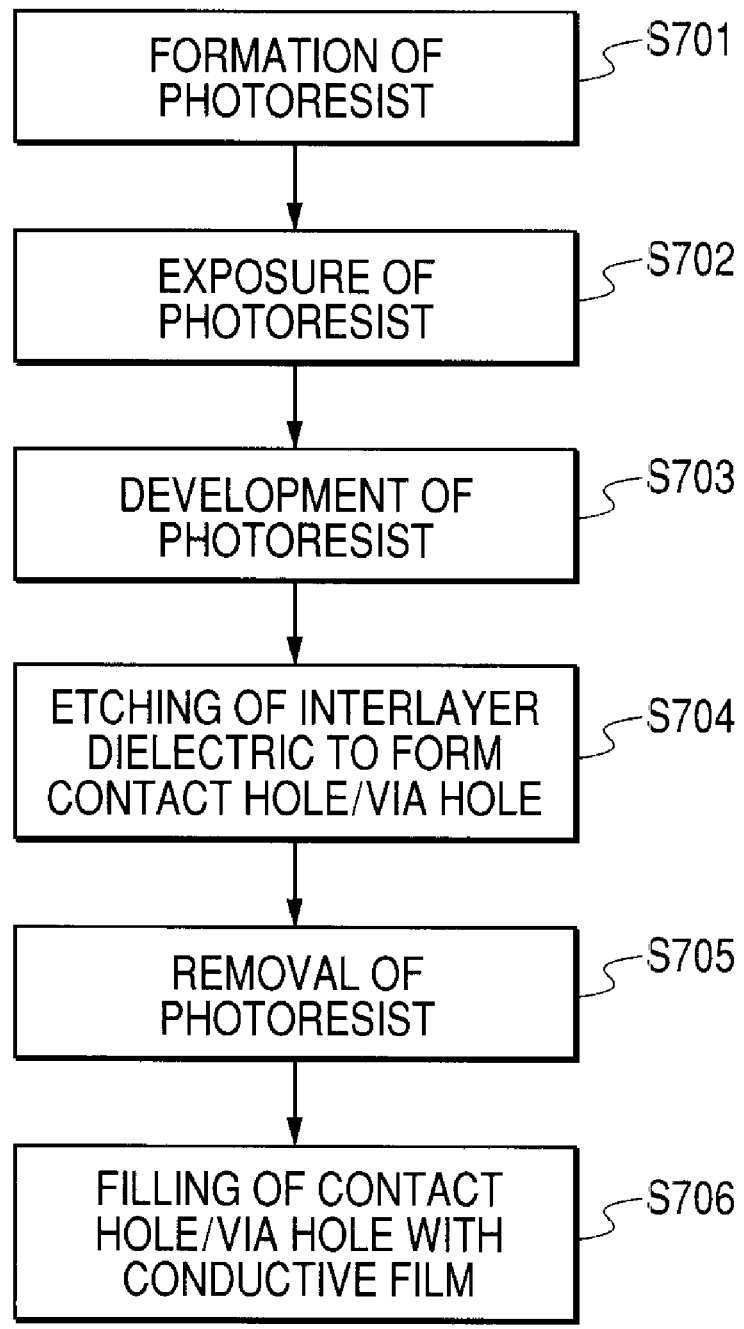
FIG. 21 is a flow chart showing a manufacturing method of a contact plug and via plug according to the embodiment of the present invention.

FIG. 21 is a flow chart showing a formation step of a contact plug 40 in Step s7 and formation step of a via plug in Step s10 in detail. The contact plug and via plug are formed in a similar manner so that the formation step of the contact plug 40 will next be described as a typical example.

Figure 22:
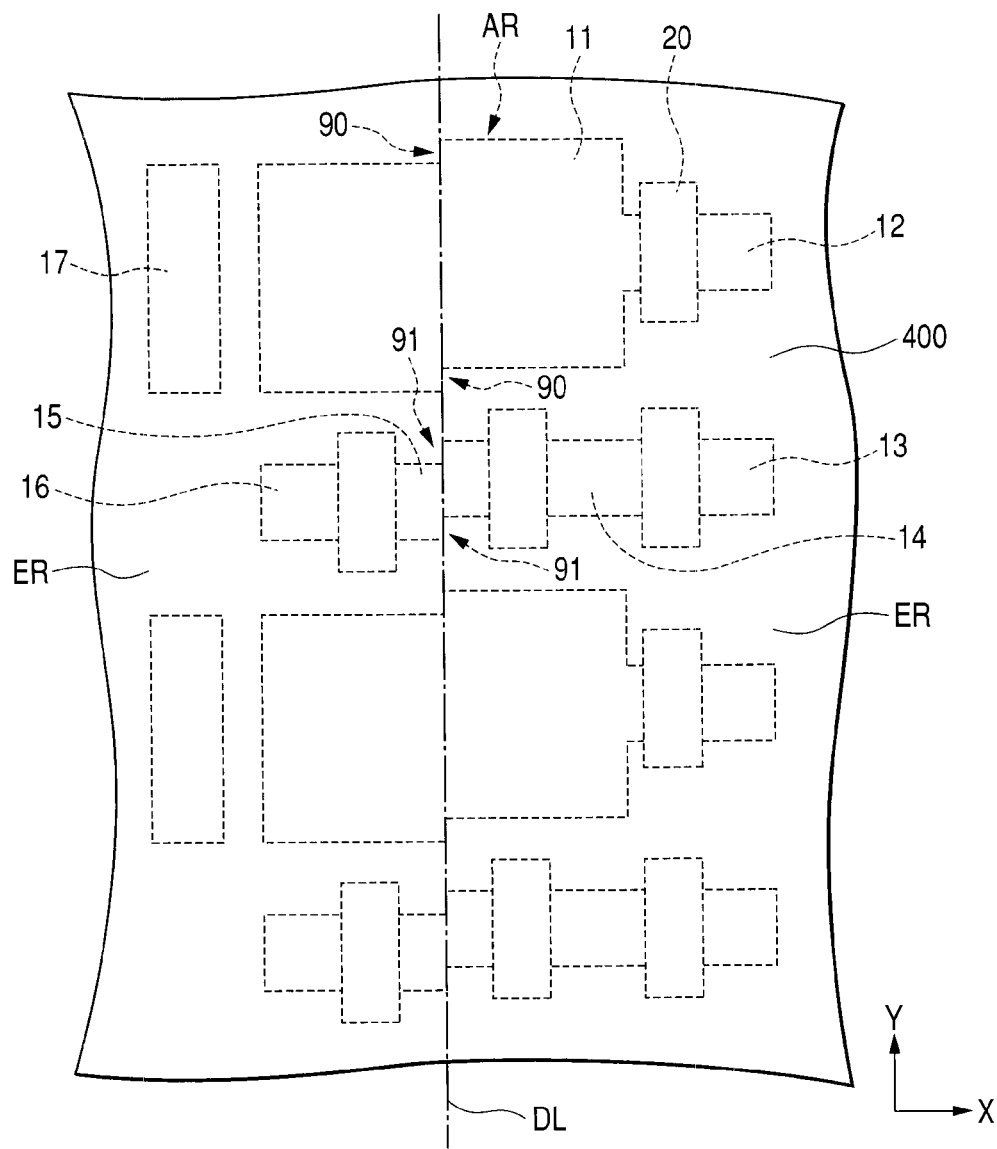
FIG. 22 is a top view illustrating a manufacturing step of the contact plug according to the embodiment of the present invention.

In Step s701, as illustrated in FIG. 21, a photoresist 400 is formed over the interlayer dielectric film 30 formed in Step s6. In subsequent step s702, the photoresist 400 is exposed using a photomask having a predetermined mask pattern formed therein. During exposure, the photoresist 400 is subjected to divided exposure treatment. FIG. 22 illustrates the way how the divided exposure treatment is performed in Step s702. As illustrated in FIG. 22, a dividing line DL for divided exposure in the photoresist 400 is set at the same position as that of the dividing line DL for divided exposure in the above-described Steps s303, s404 and s502. In Step s702, the photoresist 400 is divided into three exposure regions ER as in Steps s303, s404 and s502, and each of the three exposure regions ER is subjected to exposure treatment.

In subsequent Step s703, the photoresist 400 after exposure is developed and the resulting photoresist 400 is then, patterned. In subsequent step s704, the interlayer dielectric film 30 exposed from the photoresist 400 is etched off with the photoresist 400 as a mask. Then, the photoresist 400 used as the mask is removed in Step s705. As a result, a plurality of contact holes from which the N$^+$ type impurity region 12 and the like are exposed are formed in the interlayer dielectric film 30. When the via plug is formed in the interlayer dielectric film 60, a via hole from which the interconnect 50 is exposed is formed in the interlayer dielectric film 60.

In subsequent step s706, a conductive film to be filled in the contact holes in the interlayer dielectric film 30 is formed. A plurality of the contact plugs 40 are thus formed in the interlayer dielectric film 30. In order to form the via plug in the interlayer dielectric film 60, a conductive film is filled in the via hole formed in the interlayer dielectric film 60.

Figure 23:
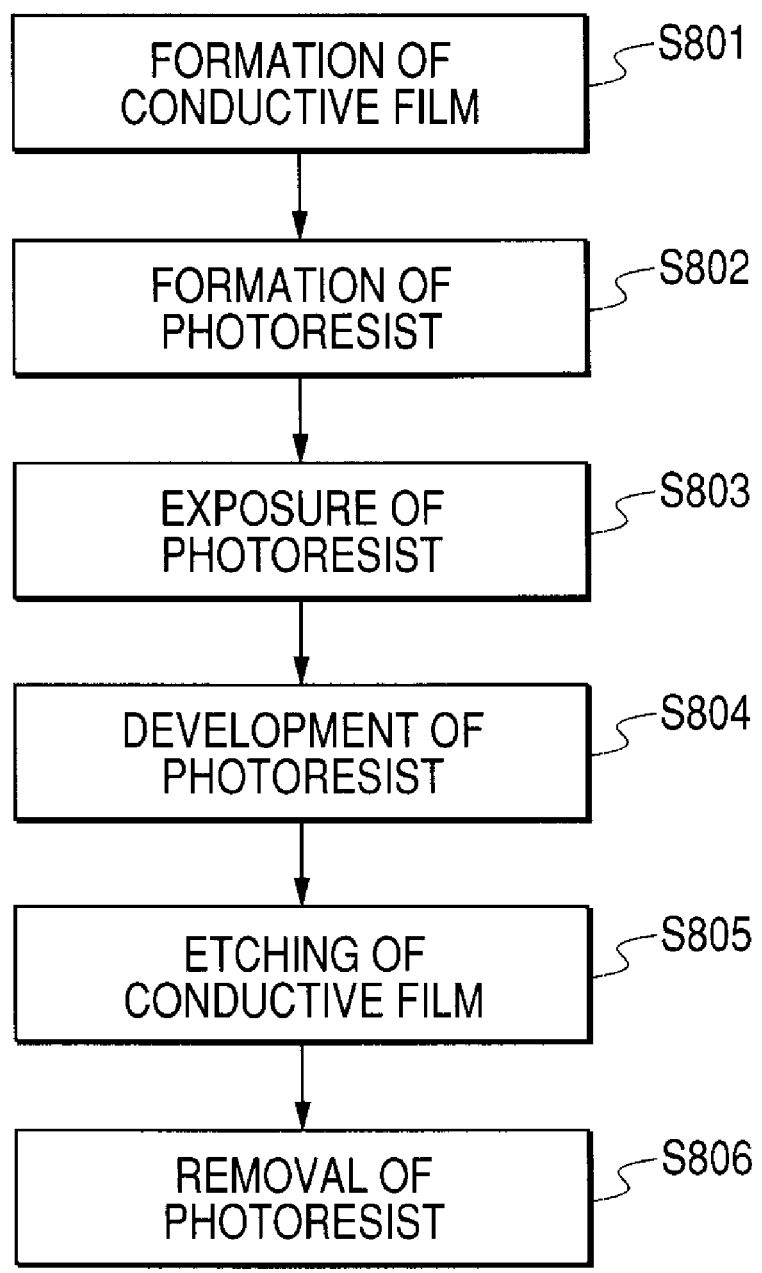
FIG. 23 is a flow chart showing a manufacturing method of an interconnect according to the embodiment of the present invention.

FIG. 23 is a flow chart specifically showing the formation step of the lower interconnect 50 in Step s8 and the formation step of the upper interconnect 80 in Step s11. The interconnects 50 and 80 are formed similarly so that the formation step of the interconnect 80 will next be described as a typical example.

In Step s801, as illustrated in FIG. 23, a conductive film 510 which will be the interconnect 80 is formed over the interlayer dielectric film 60. In Step s802, a photoresist 500 is then formed over the conductive film 510.

Figure 24:
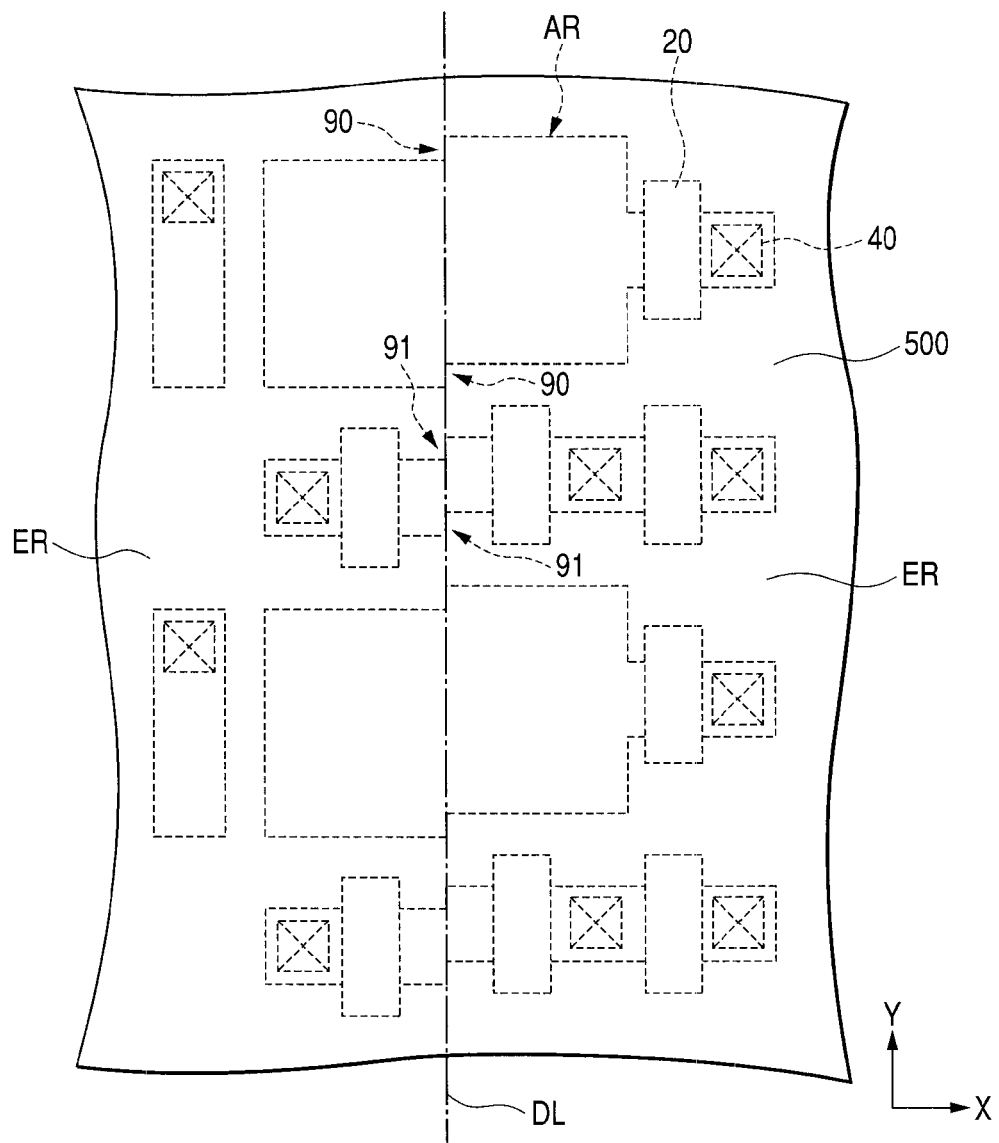
FIG. 24 is a top view illustrating a manufacturing step of the interconnect according to the embodiment of the present invention.

In Step s803, the photoresist 500 is exposed using a photomask having a predetermined mask pattern formed therein. During exposure, the photoresist 500 is subjected to divided exposure treatment. FIG. 24 shows the way how the divided exposure treatment is performed in Step s803. As illustrated in FIG. 24, a dividing line DL for divided exposure in the photoresist 500 is set at the same position as that of the dividing line DL in the above-described steps s303, s404, s502 and s702. In Step s803, similar to Steps s303, s404, s502 and s702, the photoresist 500 is divided into three exposure regions ER and exposure treatment is given to each of these three exposure regions ER.

Figure 25:
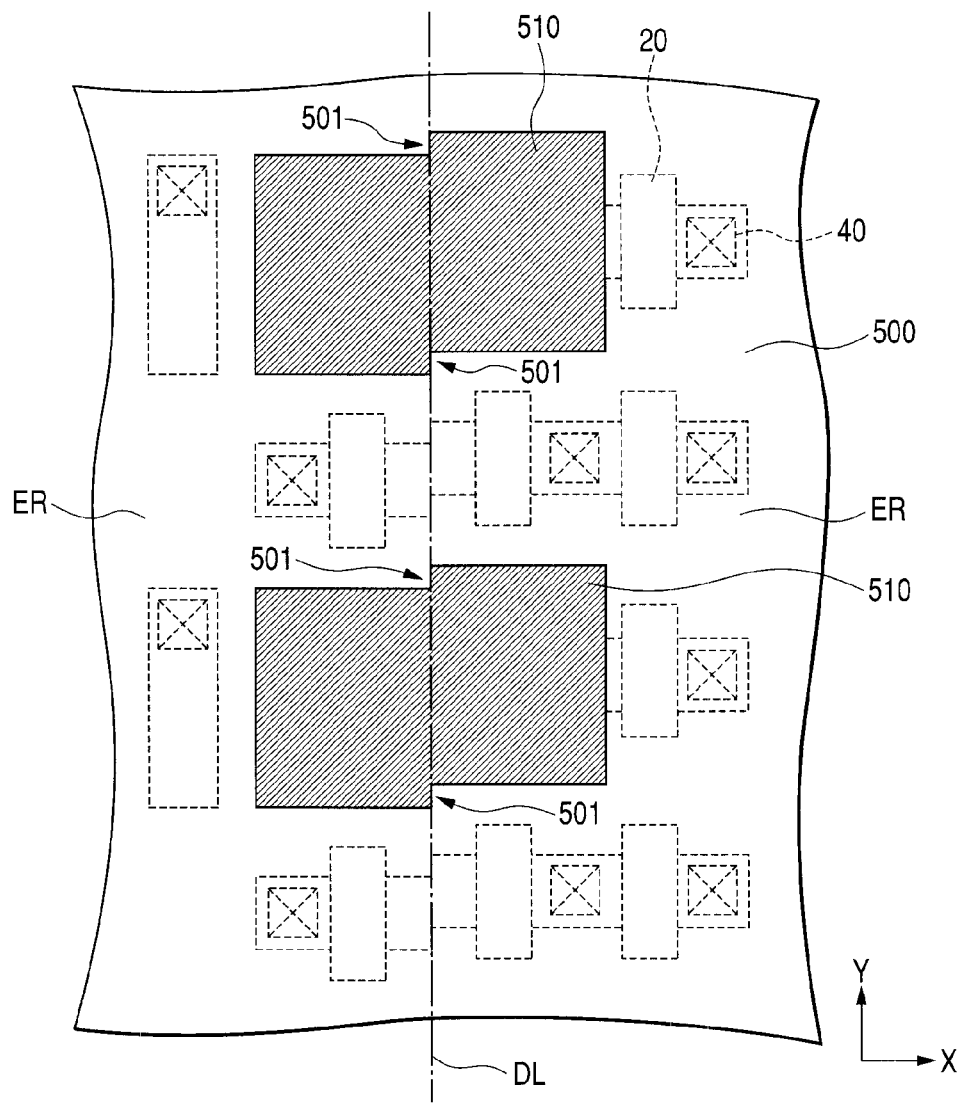
FIG. 25 is a top view illustrating a manufacturing step of the interconnect according to the embodiment of the present invention.

In Step s804, the photoresist 500 after exposure is developed and the resulting photoresist 500 is then patterned. FIG. 25 is a top view illustrating the patterned photoresist 500. As illustrated in FIG. 25, the photoresist 500 from which an upper portion of the N$^-$ type impurity region 11 in the conductive film 410 is exposed is formed over the conductive film 510.

In the patterned photoresist 500, the resist patterns are displaced in the Y axis direction between two adjacent exposure regions ER with the dividing line DL as a boundary. This occurs because when two adjacent exposure regions ER in the photoresist 500 are exposed, there occurs a misalignment in the Y axis direction between two mask patterns to be used. As a result, there appears a step difference 501 on the inner side surface of the photoresist 500 with the dividing line DL for divided exposure as a boundary.

Figure 26:
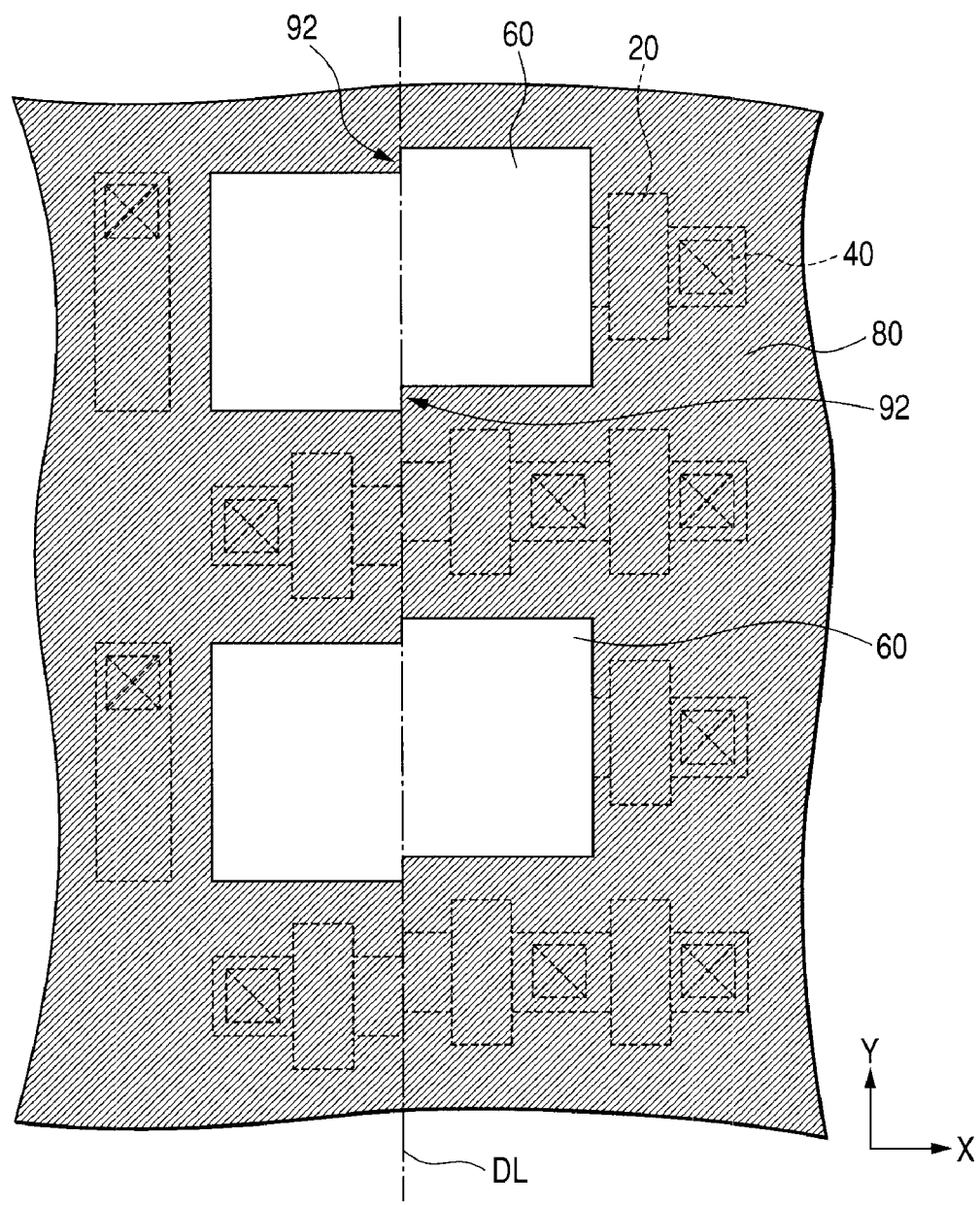
FIG. 26 is a top view illustrating a manufacturing step of the interconnect according to the embodiment of the present invention.

In Step s805, with the photoresist as a mask, the conductive film 510 exposed from the photoresist 500 is etched off. In Step s806, the photoresist 500 used as the mask is then removed. As a result, as illustrated in FIG. 26, the interconnect 80 is formed over the interlayer dielectric film 60. A step difference 92 is formed on the inner side surface of the lattice-shaped interconnect 80 according to the step difference 501 formed in the photoresist 500.

As described above, in the manufacturing method of the solid-state sensor according to this Embodiment, the dividing line DL for divided exposure of the photoresist 100 to be used for defining the active regions AR in the semiconductor substrate 1 is located at least over the region PAR of the semiconductor substrate 1 in which the active regions AR are defined.

When the dividing line DL for divided exposure is located only over a region of the semiconductor substrate 1 in which the element isolation structure 3 is formed, on the other hand, the size of the element isolation structure 3 formed below the dividing line DL may become smaller than the original size of it owing to misalignment of two mask patterns to be used for exposure of two exposure regions ER having the dividing line DL therebetween, respectively. Such an element isolation structure 3 cannot fully ensure the electrical insulation properties between elements, which may cause deterioration in the performance of the solid-state sensor of this Embodiment or malfunction. In recent years, solid-state image sensors have been required to have a large number of pixels so that a plurality of pixels 10 are densely arranged on them. This leads to a reduction in the size of the element isolation structure 3. The deterioration in the performance of the solid-state image sensor due to a size change in the element isolation structure 3 has become a prominent problem. In particular, when the dividing line DL is located only over a region in which the element isolation structure 3 present between two adjacent pixels 10 is to be formed, the original distance between pixels 10 cannot be maintained and crosstalk between the pixels 10 poses a significant problem. This results in drastic deterioration in the imaging performance of the solid-state sensor.

In this Embodiment, the dividing line of two adjacent exposure regions ER in the photoresist 100 is located not only over a region of the semiconductor substrate 1 in which the element isolation structure 3 is to be formed but also over a region of the semiconductor substrate 1 in which active regions AR are to be formed. When misalignment in the two mask patterns used for the exposure of these two exposure regions ER occurs, a portion of the element isolation structure 3 which undergoes a change can be minimized. This results in suppression of deterioration in the performance of the solid-state sensor. From another viewpoint, it is possible to increase a permissible misalignment amount of the mask pattern, leading to an improvement in the throughput or margin in the manufacture.

In this Embodiment, the dividing line for divided exposure of the photoresist 100 is located over, in a region PAR of the semiconductor substrate 1 in which active regions AR are to be formed, a region in which the N⁻ type impurity region 11 serving as a constituent element of a photodiode PD is to be formed, that is, a region in which a partial active region AR1 is to be formed. The surface area of the partial active region AR1 in which the N⁻ type impurity region 11 is to be formed can be increased over another partial active region of the active regions AR so that even a change in the size of the partial active region AR1 due to the misalignment of the mask pattern does not have a significant influence on the performance of the solid-state sensor. It is therefore possible to suppress deterioration in the performance of the present solid-state sensor further.

In this Embodiment, the dividing line DL for divided exposure of the photoresist 100 is not located over, in a region PAR of the semiconductor substrate 1 in which the active regions AR are to be formed, a region in which the N⁺ type impurity region 12 functioning as a floating diffusion FD is to be formed, that is, a region in which a partial active region AR5 is to be formed. Even misalignment in the mask pattern therefore does not lead to a change in the size of the partial active region AR5. As a result, a size change of the N⁺ type impurity region 12 can be suppressed. When a size change of the N⁺ type impurity region 12 occurs, a capacitance of charges accumulated in the floating diffusion FD changes, which may result in a change in the properties of a pixel corresponding to the pixel 10 having the N⁺ type impurity region 12. This causes deterioration in the image quality. In this Embodiment, a size change of the N⁺ type impurity region 12 due to misalignment of the mask pattern can be suppressed so that deterioration in the image quality can be prevented.

In this Embodiment, the step differences 90 and 91 are formed at the periphery, in a top view, of the active regions AR according to the position of the dividing line DL so that the position of the dividing line DL can be grasped easily by detecting the step differences 90 and 91. This facilitates size measurement of the resist pattern or size measurement of the formed device based on the dividing line DL and the results of the size measurement can be fed back to exposure conditions readily.

Further, in this Embodiment, the step difference 92 is also formed on the side surface of the interconnect 80 according to the position of the dividing line DL. The position of the dividing line DL can easily be found by detecting the step difference 92.

The dividing line DL for divided exposure treatment when the active regions AR are defined in the semiconductor substrate 1 extends, as illustrated in FIG. 9, along the Y axis direction over a region of the semiconductor substrate 1 in which the partial active region AR1 is to be formed. In other words, the dividing line DL extends over the region of the semiconductor substrate 1 in which the partial active region AR1 is to be formed and along the shorter direction of the region.

Figure 27:
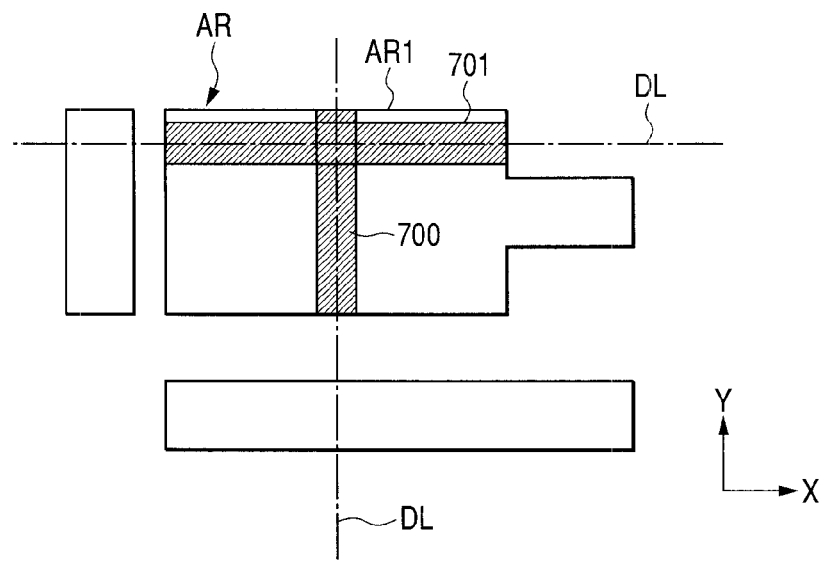
FIG. 27 is a top view showing how a variation amount of the surface area of a partial active region differs, depending on the position of a dividing line for divided exposure.

When the dividing line DL for divided exposure treatment in defining the active regions AR in the semiconductor substrate 1 extends along the X axis direction over the region of the semiconductor substrate 1 in which the partial active region AR1 is to be formed, that is, the longer direction of the region, the dividing line DL running across the region becomes long in a top view. If misalignment of the mask pattern during divided exposure occurs, a variation amount of the surface area of the partial active region AR1 increases. FIG. 27 shows it. A region 700 in FIG. 27 shows the variation amount of the surface area of the partial active region AR1 when the dividing line DL extends along the shorter direction of the region of the semiconductor substrate 1 in which the partial active region AR1 is to be formed. A region 701 in FIG. 27 shows the variation amount of the surface area of the partial active region AR1 when the dividing line DL extends along the longer direction of the region of the semiconductor substrate 1 in which the partial active region AR1 is to be formed.

Thus, when the dividing line DL for divided exposure treatment in defining the active regions AR in the semiconductor substrate 1 extends along the longer direction of the region of the semiconductor substrate 1 in which the partial active region AR1 is to be formed, a variation amount of the surface area of the partial active region AR1 due to misalignment of the mask pattern increases. Since the N⁻ type impurity region 11 of the photodiode PD is formed in the partial active region AR1, a variation in the surface area of the partial active region AR1 leads to a variation in the surface area of the N⁻ type impurity region 11 and also a variation in the sensitivity of photoelectric conversion in the photodiode PD. As a result, deterioration in the image quality occurs. As in this Embodiment, when the dividing line DL for the divided exposure treatment in defining the active regions AR in the semiconductor substrate 1 extends along the shorter direction of the region of the semiconductor substrate 1 in which the partial active region AR1 is to be formed, a variation in the surface area of the partial active region AR1 can be suppressed, leading to prevention of deterioration in the image quality.

In this Embodiment, the dividing line DL for divided exposure treatment in defining the active regions AR in the semiconductor substrate 1 is not located over regions of the semiconductor substrate 1 in which partial active regions AR2 to AR4, AR6 and AR7, among a plurality of partial active regions AR1 to AR7, to be brought into contact with the contact plug 40 are formed.

When the dividing line DL is located over, for example, a region of the semiconductor substrate 1 in which the partial active region AR2 to be brought into contact with the contact plug 40 is formed, a step difference similar to the step difference 91 of the partial active region AR5 appears at the periphery of the partial active region AR2 owing to misalignment of the mask pattern upon divided exposure and it reduces the distance between the element isolation structure 3 around the partial active region AR2 and the contact plug 40. This may increase the leakage current between the contact plug 40 and the well region 2.

In this Embodiment, when misalignment of the mask pattern occurs during divided exposure, a step difference appears at the periphery of the partial active regions AR1 and AR5 which are not contiguous to the contact plug 40 so that an increase in the leakage current between the contact plug 40 and well region 2 which will otherwise occur by the misalignment of the mask pattern can be inhibited.

In manufacturing steps of a semiconductor device, when two structures formed successively are aligned, it is the common practice to design, based on a mask pattern of a photo mask to be used for the first step, a mask pattern of a photo mask to be used for the subsequent step in order to heighten the alignment accuracy of these two structures and achieve miniaturization of the device. For example, the gate electrode 20 used for the latter step is aligned with the active region AR to be formed in the former step so that the mask pattern of a photomask used for the formation of the gate electrode 20 is designed based on a mask pattern of a photomask to be used for defining the active regions AR in the semiconductor substrate 1. Further, the contact plug 40 is aligned with the gate electrode 20 so that a mask pattern of a photomask to be used for the formation of the contact plug 40 is designed based on a mask pattern of a photomask to be used for the formation of the gate electrode 20. The lower interconnect 50 is aligned with the contact plug 40 so that a mask pattern of a photomask to be used for the formation of the interconnect 50 is designed based on a mask pattern of a photomask to be used for the formation of the contact plug 40. The via plug is aligned with the interconnect 50 so that a mask pattern of a photomask to be used for the formation of the via plug is designed based on a mask pattern of a photomask to be used for the formation of the interconnect 50. The upper interconnect 80 is aligned with the via plug so that a mask pattern of a photomask to be used for the formation of the interconnect 80 is designed based on a mask pattern of a photomask to be used for the formation of the via plug.

In two steps for forming two respective structures to be aligned with each other, it is preferred to set the dividing lines DL for divided exposure at the same position. For example, dividing lines DL for divided exposure for defining the active regions AR in the semiconductor substrate 1 and for forming the gate electrode 20, as in this Embodiment, are preferably set at the same position.

Figure 28:
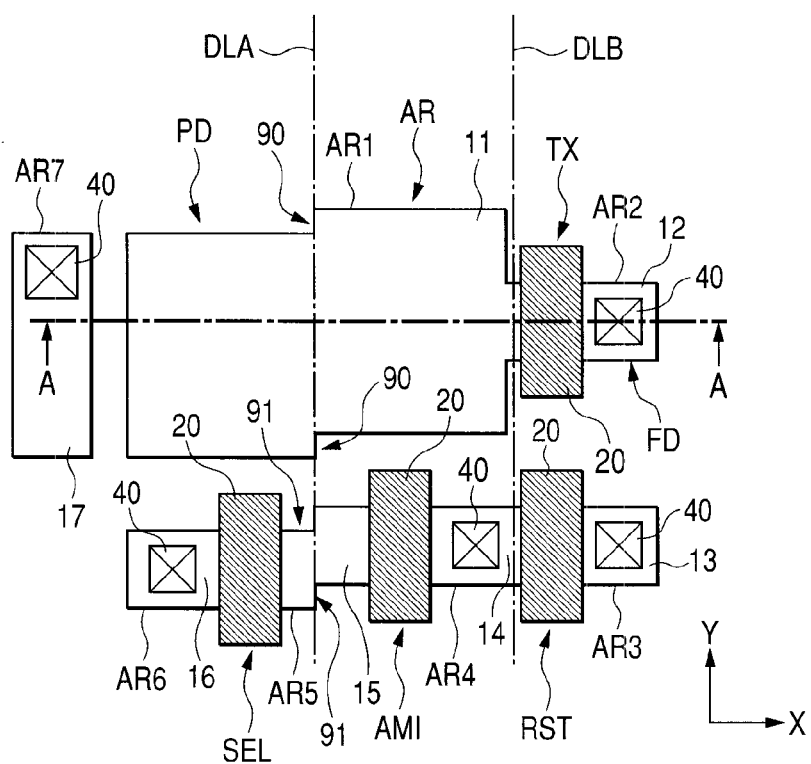
FIG. 28 is a top view for describing a reduction in the yield due to a positional change of a dividing line for divided exposure.

When in two steps for forming two respective structures to be aligned with each other, the dividing lines for divided exposure are set at different positions, deterioration in alignment accuracy due to misalignment of the mask pattern may reduce the yield. For example, as illustrated in FIG. 28, supposing that a dividing line DLA, which is a dividing line DL for the formation of the gate electrode 20, is set over the partial active region AR5 and a dividing line DLB, which is a dividing line DL for the formation of the contact plug 40, is set over a region of the partial active region AR4 closer to side of the partial active region AR3 (right side on the diagram) than to the formation region of the contact plug 40 to be brought into contact with the partial active region AR4, the distance between the gate electrode 20 of the amplified MOS imager transistor AMI and the contact plug 40 over the partial active region AR4 may become a permissible distance or less and a reduction in the yield may occur when a mask pattern to be used for exposure of an exposure region ER closer to the side of the partial active region AR4 (right side on the diagram) than to the dividing line DLA is displaced in the X axis arrow direction (right direction in the diagram) during formation of the gate electrode 20 and a mask pattern to be used for the exposure of an exposure region ER closer to the side of the partial active region AR5 (left side in the diagram) than to the dividing line DLB is displaced in a direction (left direction in the diagram) opposite to the X axis arrow direction during formation of the contact plug 40.

As in this Embodiment, in two steps for forming two structures to be aligned with each other, it is possible to improve the alignment accuracy and as a result, improve the yield by setting dividing lines DL for divided exposure at the same position.

Figure 29:
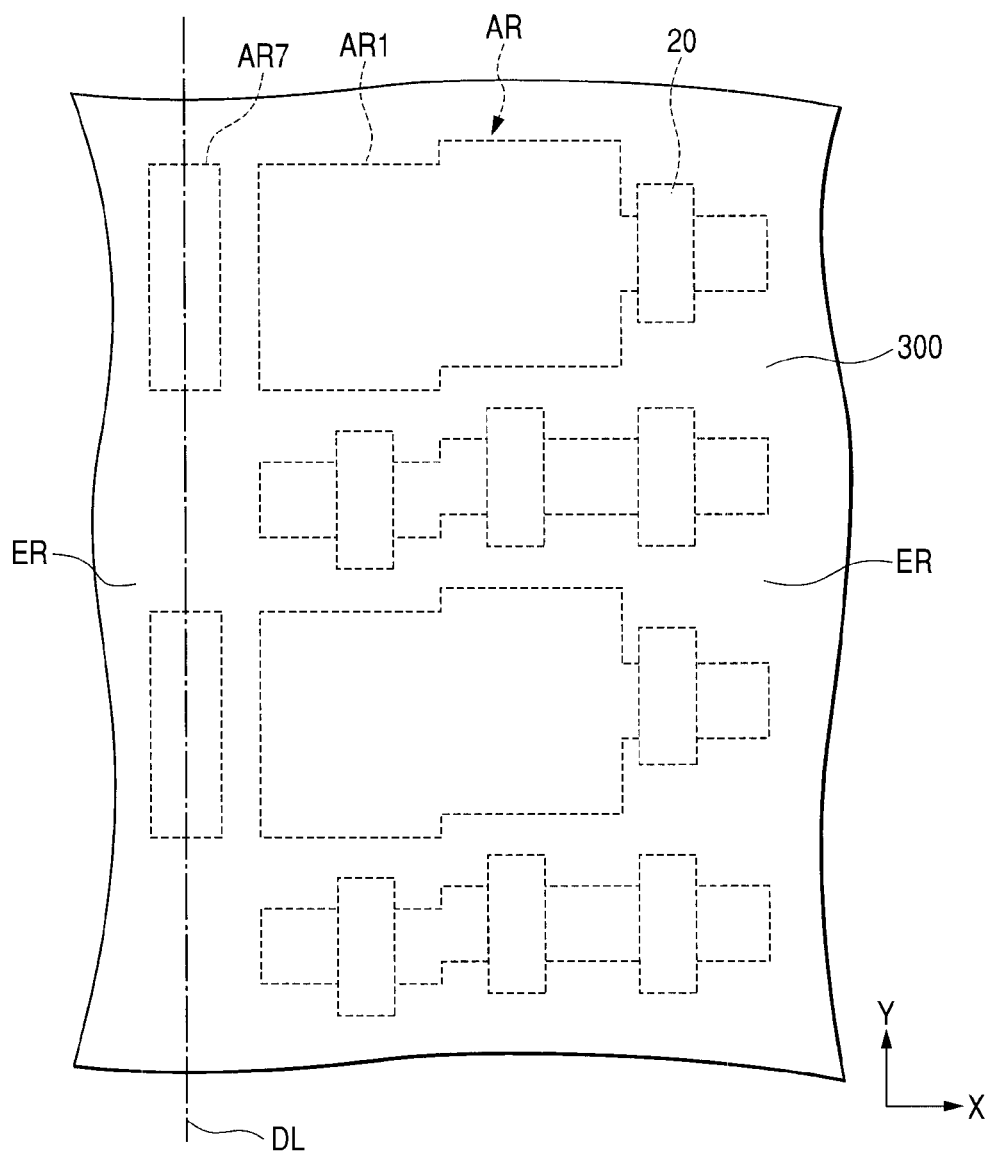
FIG. 29 is a top view illustrating a modification example of the manufacturing step of the impurity region according to the embodiment of the present invention.

The dividing line DL for divided exposure treatment for forming the $N^-$ type impurity region 11 in the semiconductor substrate 1 is preferably located not over the partial active region AR1 as illustrated in FIG. 29. When the dividing line DL for forming the $N^-$ type impurity region 11 is located over the partial active region AR1, misalignment of the mask pattern during divided exposure causes a change in the shape of the opening portion 300a of the photoresist 300 and a change in the shape of the $N^-$ type impurity region 11, which may result in a drastic change in the sensitivity of photoelectric conversion in the photodiode PD. This deteriorates the image quality. Accordingly, it is possible to suppress a change in the shape of the $N^-$ type impurity region 11 and prevent deterioration in the image quality by not locating the dividing line DL for forming the $N^-$ type impurity region 11 over the partial active region AR1.

As illustrated in FIG. 29, it is preferred to always locate the dividing lines DL for forming the $N^-$ type impurity region 11, $N^+$ type impurity region 12, source/drain regions 13 to 16 and $P^+$ type impurity region 17 only over the partial active region AR7 of the active regions AR. In this case, the dividing lines DL for forming these impurity regions are located at predetermined positions so that photomasks can be designed more easily. When the $N^-$ type impurity region 11 is formed, since the dividing line DL is not located over the partial active region AR1, deterioration of image quality can be restrained. When the $P^+$ type impurity region is formed, the dividing line is located over the partial active region AR7 so that the shape of the $P^+$ type impurity region 17 may change due to misalignment of the mask pattern upon divided exposure. Since the $P^+$ type impurity region 17 is an impurity region to which a ground potential GND, a negative-side power supply potential, is applied, even a change in the shape of the $P^+$ type impurity region 17 does not lead to a substantial change in the properties of the pixel 10.

In the present invention relating to the solid-state image sensor, the active regions AR having the pixels 10 formed therein include partial active regions AR1 and AR5 having step differences 90 and 91, respectively, at the periphery in a top view so that when the photoresist 100 to be used for defining the active regions AR in the semiconductor substrate 1 is subjected to divided exposure with the positions of the step differences 90 and 91 of the partial active regions AR1 and AR5 as a boundary, the positions of the dividing lines DL for divided exposure can be found easily by detecting the step differences 90 and 91.

Further, the interconnect 80 has, on the side surface thereof, the step difference 92. When the interconnect 80 is formed, divided exposure is performed with the position of the difference 92 as a boundary, the dividing line DL for divided exposure can be found readily by detecting the step difference 92.

Since the contact plugs 40 are not contiguous onto the partial active regions AR1 and AR5 having at the periphery thereof step differences 90 and 91, respectively, an increase in the leakage current between the contact plug 40 and well region 2 can be inhibited.

What is claimed is:

1. A method for manufacturing a solid-state image sensor, comprising the steps of:
   (a) providing a substrate,
   (b) forming a first photoresist over the substrate,
   (c) exposing the first photoresist,
   (d) after the step (c), developing the first photoresist and patterning the first photoresist, and
   (e) forming, in the substrate, an element isolation structure for defining an active region having a pixel of the solid-state image sensor formed therein in the substrate, by using the first photoresist patterned in the step (c),
   the step (c) further comprising the steps of:
   (c-1) exposing a first region of the first photoresist; and
   (c-2) exposing a second region of the first photoresist which region is adjacent to the first region,
   wherein a dividing line between the first region and the second region in the step (c) is located at least over a region of the substrate in which the active region is defined.

2. A method for manufacturing a solid-state image sensor according to claim 1,
   wherein the pixel includes photodiode having a first impurity region,
   wherein the active region includes a first partial active region in which the first impurity region is to be formed, and
   wherein the dividing line in the step (c) is located at least over a region of the substrate in which the first partial active region is formed.

3. A method for manufacturing a solid-state image sensor according to claim 1,
   wherein the pixel includes a photodiode and an impurity region functioning as floating diffusion for accumulating therein charges generated at the photodiode by photoelectric conversion,
   wherein the active region includes a partial active region in which the impurity region is to be formed, and
   wherein the dividing line in the step (C) is not located over a region of the substrate in which the partial active region is formed.

4. A method for manufacturing a solid-state image sensor according to claim 1,
   wherein the first photoresist patterned in the step (d) has, over the side surface thereof, a step difference formed with the dividing line in the step (c) as a boundary, and
   wherein in the step (e), a step difference also appears at the periphery, in a top view, of the active region according to the step difference formed in the first photoresist.

5. A method for manufacturing a solid-state image sensor according to claim 4,
   further comprising the steps of:
   (f) after the step (e), forming a second photoresist over the substrate;
   (g) exposing the second photoresist; and
   (h) after the step (g), developing the second photoresist and patterning the second photoresist,
   wherein the step (g) further comprises the steps of:
   (g-1) exposing a first region of the second photoresist; and
   (g-2) exposing a second region of the second photoresist adjacent to the first region,
   wherein a dividing line between the first region and second region in the step (g) is set at the same position as that of the dividing line in the step (c), and
   the method further comprising the steps of:
   (i) after the step (h), detecting the step difference in the active region to determine the position of the dividing line in the step (g); and
   (j) after the step (i), measuring a dimension of a predetermined portion of at least one of the first and second regions of the second photoresist.

6. A method for manufacturing a solid-state image sensor according to claim 5, further comprising a step of:
   (k) controlling exposure conditions based on the measurement results in the step (j).

7. A method for manufacturing a solid-state image sensor according to claim 2,
   further comprising the steps of:
   (f) after the step (e), forming a second photoresist over the substrate;
   (g) exposing the second photoresist;
   (h) developing the second photoresist and patterning the second photoresist; and
   (i) introducing an impurity into a first partial active region exposed from the second photoresist patterned in the step (h) to form the first impurity region in the first partial active region,
   wherein the step (g) further comprises the steps of:
   (g-1) exposing a first region of the second photoresist; and
   (g-2) exposing a second region of the second photoresist adjacent to the first region, and
   wherein a dividing line between the first and second regions in the step (g) is located at least over the active region and is not located over the first partial active region.

8. A method for manufacturing a solid-state image sensor according to claim 7,
   wherein the pixel includes a second impurity region to which a power supply potential is to be applied,
   wherein the active region further includes a second partial active region in which the second impurity region is to be formed,
   the method further comprising the steps of:
   (j) after the step (e), forming a third photoresist over the substrate;
   (k) exposing the third photoresist;
   (l) developing the third photoresist and patterning the third photoresist; and
   (m) introducing an impurity into the second partial active region exposed from the third photoresist patterned in the step (l) to form the second impurity region in the second partial active region,
   the step (k) further comprising the steps of:
   (k-1) exposing a first region of the third photoresist; and
   (k-2) exposing a second region of the third photoresist adjacent to the first region, and
   wherein a dividing line in the step (g) and a dividing line between the first and second regions in the step (k) are set at the same position, are located at least over the second partial active region and are not located over the first partial active region.

9. A method for manufacturing a solid-stage image sensor according to claim 1,
   wherein the active region includes a partial active region having an impurity region formed therein and extending in one direction, and
   wherein the dividing line in the step (c) extends, over a region of the substrate in which the partial active region is to be formed, at least along a shorter direction of the region.

10. A method for manufacturing a solid-state image sensor according to claim 1,
wherein the active region includes a plurality of partial active regions having a plurality of impurity regions formed therein, respectively,
the method further comprising the steps of:
(f) after the step (e), forming the impurity regions; and
(g) after the step (f), forming a contact plug to be brought into contact with some of the partial regions, and
wherein the dividing line in the step (c) is not located over a region of the substrate in which some of the partial active regions are formed.

11. A method for manufacturing a solid-state image sensor according to claim 10,
wherein the pixel comprises:
a photodiode;
a floating diffusion for accumulating therein charges generated by photoelectric conversion in the photodiode;
a first MOS transistor for amplifying a potential of the floating diffusion; and
a second MOS transistor for selecting whether the potential amplified by the first MOS transistor is output to an output line,
wherein the impurity regions include a source/drain region held in common by the first arid second MOS transistors and not contiguous with contact plug, and
wherein the dividing line in the step (c) is located at least over a region of the substrate in which a partial active region, of the partial active regions, in which the source/drain region is to be formed.

12. A method for manufacturing a solid-state image sensor according to claim 4,
the method further comprising the steps of:
(f) after the step (e), forming a conductive film over the substrate;
(g) forming a second photoresist over the conductive film;
(h) exposing the second photoresist;
(i) developing the second photoresist and patterning the second photoresist; and
(j) removing the conductive film exposed from the second photoresist patterned in the step (i) to form an interconnect,
the step (h) further comprising the steps of:
(h-1) exposing a first region of the second photoresist; and
(h-2) exposing a second region of the second photoresist adjacent to the first region,
wherein a dividing line between the first and second regions in the step (h) is located at least over the active region,
wherein a step difference is formed over the side surface of the second photoresist patterned in the step (i) with the dividing line in the step (h) as a boundary, and
wherein in the step (j), a step difference appears also over the side surface of the interconnect according to a step difference formed in the second photoresist.

\* \* \* \* \*